United States Patent
Sung et al.

(10) Patent No.: US 9,806,015 B1
(45) Date of Patent: Oct. 31, 2017

(54) SEMICONDUCTOR PACKAGES INCLUDING THROUGH MOLD BALL CONNECTORS ON ELEVATED PADS AND METHODS OF MANUFACTURING THE SAME

(71) Applicant: SK hynix Inc., Icheon-si, Gyeonggi-do (KR)

(72) Inventors: Ki Jun Sung, Cheongju-si (KR); Jong Hoon Kim, Suwon-si (KR); Han Jun Bae, Seongnam-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/419,267

(22) Filed: Jan. 30, 2017

(30) Foreign Application Priority Data

May 31, 2016 (KR) .................. 10-2016-0067407

(51) Int. Cl.
*H01L 21/00* (2006.01)
*H01L 23/02* (2006.01)
*H01L 23/498* (2006.01)
*H01L 23/31* (2006.01)
*H01L 25/065* (2006.01)
*H01L 25/18* (2006.01)
*H01L 21/48* (2006.01)
(Continued)

(52) U.S. Cl.
CPC .... *H01L 23/49838* (2013.01); *H01L 21/4853* (2013.01); *H01L 21/565* (2013.01); *H01L 23/3114* (2013.01); *H01L 23/49816* (2013.01); *H01L 24/16* (2013.01); *H01L 25/0652* (2013.01); *H01L 25/0657* (2013.01); *H01L 25/071* (2013.01); *H01L 25/112* (2013.01); *H01L 25/18* (2013.01); *H01L 25/50* (2013.01); *H01L 2224/13147* (2013.01); *H01L 2224/1403* (2013.01); *H01L 2224/16227* (2013.01); *H01L 2225/06572* (2013.01)

(58) Field of Classification Search
CPC ..... H01L 2224/1403; H01L 224/13147; H01L 25/0652; H01L 25/071; H01L 25/112
USPC ......................................... 257/686; 438/106
See application file for complete search history.

(56) References Cited

U.S. PATENT DOCUMENTS 9,615,456 B2 * 4/2017 Haba ........................ H05K 1/11
9,666,571 B2 * 5/2017 Kao ........................ H01L 25/50
(Continued)

FOREIGN PATENT DOCUMENTS

| KR | 1020040060843 A | 7/2004 |
|---|---|---|
| KR | 1020140022255 A | 2/2014 |

*Primary Examiner* — David Vu
*Assistant Examiner* — Brandon Fox
(74) *Attorney, Agent, or Firm* — William Park & Associates, Ltd.

(57) ABSTRACT

A semiconductor package includes first bump pads on a first surface of an interconnection structure layer, elevated pads thicker than the first bump pads on the first surface of the interconnection structure layer, a first semiconductor device connected on the first bump pads, through mold ball connectors connected on the elevated pads, respectively, a molding layer disposed covering the first surface of the interconnection structure layer to expose a portion of each of the through mold ball connectors, outer connectors respectively attached to the through mold ball connectors, and a second semiconductor device on a second surface of the interconnection structure layer opposite to the molding layer.

20 Claims, 30 Drawing Sheets

(51) Int. Cl.
*H01L 21/56* (2006.01)
*H01L 25/00* (2006.01)
*H01L 23/00* (2006.01)
*H01L 25/07* (2006.01)
*H01L 25/11* (2006.01)

(56) References Cited

U.S. PATENT DOCUMENTS

| | | | |
|---|---|---|---|
| 2015/0235915 A1 | 8/2015 | Liang et al. | |
| 2015/0235993 A1* | 8/2015 | Cheng | H01L 25/50 257/712 |
| 2017/0062383 A1* | 3/2017 | Yee | H01L 25/0652 |
| 2017/0103965 A1* | 4/2017 | Kim | H01L 25/0652 |

* cited by examiner

SEMICONDUCTOR PACKAGES INCLUDING THROUGH MOLD BALL CONNECTORS ON ELEVATED PADS AND METHODS OF MANUFACTURING THE SAME

CROSS-REFERENCE TO RELATED APPLICATIONS

The present application claims priority under 35 U.S.C 119(a) to Korean Patent Application No. 10-2016-0067407, filed on May 31, 2016, which is incorporated herein by reference in its entirety.

BACKGROUND

1. Technical Field

Embodiments of the present disclosure relate to semiconductor packages including through mold ball connectors on elevated pads and methods of manufacturing the same.

2. Related Art

In the electronics industry, a plurality of semiconductor devices is unified in one integrated package with the development of multi-functional, larger storage capacity and smaller electronic systems or products. The one integrated package may be designed to have a reduced total size and to perform various functions. The integrated package may be realized to include a plurality of semiconductor chips having different functions. This is for processing a large amount of data at a time. A system-in-package (SIP) has been proposed to realize the integrated package. For example, a lot of effort has been focused on integrating at least one microprocessor and at least one memory chip in a single system-in-package.

SUMMARY

According to an embodiment, there is provided a method of manufacturing a semiconductor package. The method includes forming an interconnection structure layer including conductive trace patterns and a dielectric layer on a dummy wafer; attaching a carrier wafer to a second surface of the interconnection structure layer opposite to the dummy wafer; recessing the dummy wafer to expose a first surface of the interconnection structure layer opposite to the carrier wafer; forming first bump pads and elevated pads on the first surface of the interconnection structure layer, the elevated pads being thicker than the first bump pads; connecting at least one first semiconductor device to the first bump pads; connecting through mold ball connectors to the elevated pads; forming a molding layer on the first surface of the interconnection structure layer to expose a portion of each of the through mold ball connectors; attaching outer connectors to the exposed portions of the through mold ball connectors, respectively; and mounting a second semiconductor device on the second surface of the interconnection structure layer.

According to another embodiment, there is provided a method of manufacturing a semiconductor package. The method includes forming first bump pads and elevated pads on a first surface of an interconnection structure layer, the elevated pads being thicker than the first bump pads; connecting at least one first semiconductor device to the first bump pads; connecting through mold ball connectors to the elevated pads; forming a molding layer on the first surface of the interconnection structure layer to expose a portion of each of the through mold ball connectors; attaching outer connectors to the exposed portions of the through mold ball connectors, respectively; and mounting a second semiconductor device on the second surface of the interconnection structure layer.

According to another embodiment, a semiconductor package includes first bump pads on a first surface of an interconnection structure layer, elevated pads thicker than the first bump pads on the first surface of the interconnection structure layer, a first semiconductor device connected on the first bump pads, through mold ball connectors connected on the elevated pads, respectively, a molding layer disposed covering the first surface of the interconnection structure layer to expose a portion of each of the through mold ball connectors, outer connectors respectively attached to the through mold ball connectors, and a second semiconductor device on a second surface of the interconnection structure layer opposite to the molding layer.

According to another embodiment, there is provided a memory card including a semiconductor package. The semiconductor package includes first bump pads on a first surface of an interconnection structure layer, elevated pads thicker than the first bump pads on the first surface of the interconnection structure layer, a first semiconductor device connected on the first bump pads, through mold ball connectors connected on the elevated pads, respectively, a molding layer disposed covering the first surface of the interconnection structure layer to expose a portion of each of the through mold ball connectors, outer connectors respectively attached to the through mold ball connectors, and a second semiconductor device on a second surface of the interconnection structure layer opposite to the molding layer.

According to another embodiment, there is provided an electronic system including a semiconductor package. The semiconductor package includes first bump pads on a first surface of an interconnection structure layer, elevated pads thicker than the first bump pads on the first surface of the interconnection structure layer, a first semiconductor device connected on the first bump pads, through mold ball connectors connected on the elevated pads, respectively, a molding layer disposed covering the first surface of the interconnection structure layer to expose a portion of each of the through mold ball connectors, outer connectors respectively attached to the through mold ball connectors, and a second semiconductor device on a second surface of the interconnection structure layer opposite to the molding layer.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Figure 1:
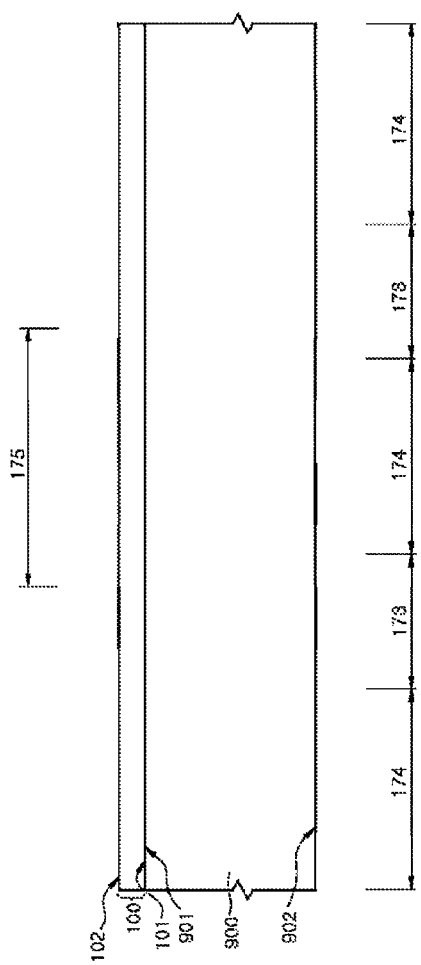
FIGS. 1 to 25 illustrate a method of manufacturing a semiconductor package according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms first, second, third etc. may be used herein to describe various elements, these elements should not be limited by these terms. These terms are only used to distinguish one element from another element, but not used to define only the element itself or to mean a particular sequence.

Semiconductor packages according to the following embodiments may correspond to system-in-packages (SIPs). Each of the semiconductor packages may be realized to include a plurality of semiconductor devices, at least two of which are designed to have different functions. The semiconductor devices may be obtained by separating a semiconductor substrate such as a wafer including electronic circuits into a plurality of pieces such as semiconductor dies or semiconductor chips by using a die sawing process. Alternatively, each of the semiconductor devices may have a package form including a package substrate and a semiconductor die mounted on the package substrate. Each of the semiconductor devices may include a plurality of semiconductor dice which are vertically stacked to have a three-dimensional structure, and the plurality of semiconductor dice may be electrically connected to each other by silicon through vias (TSVs) penetrating the plurality of semiconductor dice. The semiconductor dice may correspond to memory chips including dynamic random access memory (DRAM) circuits, static random access memory (SRAM) circuits, flash circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The semiconductor chips or the semiconductor packages may be employed in communication systems such as mobile phones, electronic systems associated with biotechnology or health care, or wearable electronic systems.

In some embodiments, the semiconductor chip may correspond to a logic chip having a system-on-chip (SoC) form. The SoC may be an application specific integrated circuit (ASIC) chip including a microprocessor, a microcontroller, a digital signal processing core or an interface. The SoC may include a central processing unit (CPU) or a graphics processing unit (GPU). In order that the SoC operates at a high speed, the SoC has to communicate with a memory chip storing data at a high speed. That is, a short interface path and a high signal bandwidth may be required to improve an operation speed of the SoC. For example, if a GPU chip and a high bandwidth memory (HBM) chip are vertically stacked in a single SIP, an interface path between the GPU chip and the HBM chip may be reduced to improve an operation speed of the GPU chip.

In an electronic system, a bottleneck phenomenon in communication between a memory chip and a processor chip may degrade the performance of the electronic system. Accordingly, high performance memory chips such as HBM chips may be employed as memory chips of the electronic systems. The HBM chip may be configured to include a plurality of memory dice which are vertically stacked using a TSV technique to obtain a high bandwidth thereof. The HBM chip may include a plurality of TSVs connected to each of the memory dice to independently control the respective memory dice which are vertically stacked. Each of the memory dice may be configured to include two memory channels, and a plurality of TSVs, for example, one hundred and twenty eight TSVs acting as input/output (I/O) pins may be required for operation of each memory channel. Accordingly, an HBM chip comprised of four stacked memory dice may include one thousand and twenty four TSVs to independently control eight memory channels. In such a case, one of the eight memory channels may independently communicate with another one of the eight memory channels through the TSVs. Thus, a signal bandwidth of the HBM chip may be broadened because each memory channel independently and directly receives or outputs signals through the TSVs.

However, if the number of the TSVs increases in the HBM chip, a pitch size of interconnection lines or pads connected to the HBM chip may be extremely reduced. Therefore, the following embodiments provide various SIPs having a configuration that electrically connects the HBM chip to the ASIC chip using an interconnection structure layer realized with a wafer processing technique which is capable of forming very fine patterns.

The same reference numerals refer to the same elements throughout the specification. Thus, even though a reference numeral is not mentioned or described with reference to a drawing, the reference numeral may be mentioned or described with reference to another drawing. In addition, even though a reference numeral is not shown in a drawing, it may be mentioned or described with reference to another drawing.

FIGS. 1 to 25 illustrate a method of manufacturing a semiconductor package.

FIG. 1 illustrates a step of forming an interconnection structure layer 100 on a dummy wafer 900. The dummy wafer 900 may be a wafer having a first surface 901 and a second surface 902 which are opposite to each other. The interconnection structure layer 100 may be formed on the first surface 901 of the dummy wafer 900. The interconnection structure layer 100 may be formed by using a silicon processing technique or a semiconductor processing technique. The interconnection structure layer 100 may be formed by sequentially or alternately stacking a plurality of dielectric layers and a plurality of conductive layers. Each of the conductive layers included in the interconnection structure layer 100 may be patterned after it is stacked. The interconnection structure layer 100 may be formed to have a first surface 101 that faces and contacts the first surface 901 of the dummy wafer 900 and to have a second surface 102 which is opposite to the dummy wafer 900. A multi-layered interconnection structure may be built in the interconnection structure layer 100 to electrically connect some members disposed on the first surface 101 of the interconnection structure layer 100 to each other. The interconnection structure layer 100 may be formed to include a plurality of stacked dielectric layers that electrically insulate or physically separate conductive trace patterns from each other.

The dummy wafer 900 may be used as a supporter or a substrate when the interconnection structure layer 100 is formed. The dummy wafer 900 may be a bare silicon wafer. Alternatively, the dummy wafer 900 may be a non-semiconductor wafer. For example, the dummy wafer 900 may be a wafer including an insulation material or a dielectric material. In some embodiments, the dummy wafer 900 may be a sapphire wafer or a silicon on insulator (SOI) wafer. If a bare silicon wafer is used as the dummy wafer 900, the interconnection structure layer 100 may be formed using semiconductor wafer processing apparatuses and semiconductor wafer processing techniques.

As described more fully with reference to later drawings, first semiconductor devices and outer connectors may be disposed on the first surface 101 of the interconnection structure layer 100. Second semiconductor devices may be disposed on the second surface 102 of the interconnection structure layer 100. The first surface 101 of the interconnection structure layer 100 may have first regions 173 on which first semiconductor devices are disposed and second regions 174 on which outer connectors are disposed. The second regions 174 may be set to be located between the first regions 173. The second surface 102 of the interconnection structure layer 100 may have a third region 175 on which a second semiconductor device will be disposed. One of the second regions 174 may be vertically overlapped with the third region 175.

Although processes for forming the interconnection structure layer 100 are described hereinafter in conjunction with wafer processing techniques, the present disclosure is not limited thereto. For example, the interconnection structure layer 100 may be formed by changing or modifying a process sequence or pattern shapes used in the following embodiments. In some embodiments, the interconnection structure layer 100 may be formed using processes for forming general redistribution lines. The dummy wafer 900 may provide the first surface 901 having a flat surface profile. Thus, the interconnection structure layer 100 may be formed to include conductive trace patterns having a fine pitch.

Figure 2:
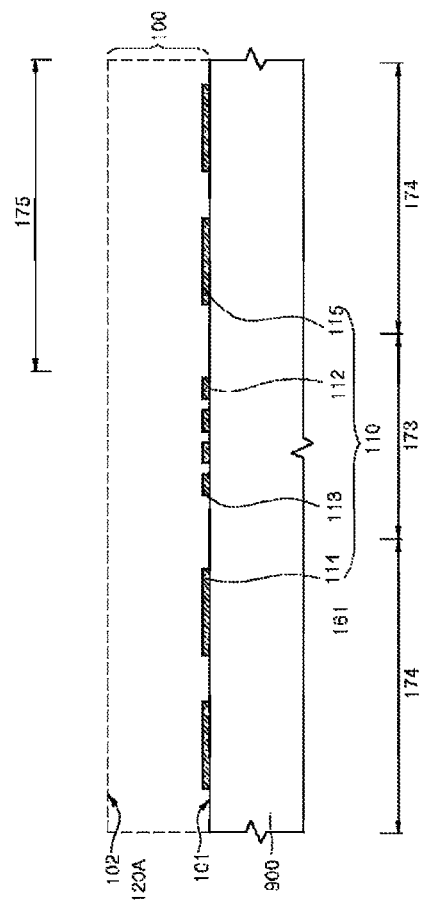
Figure 3:
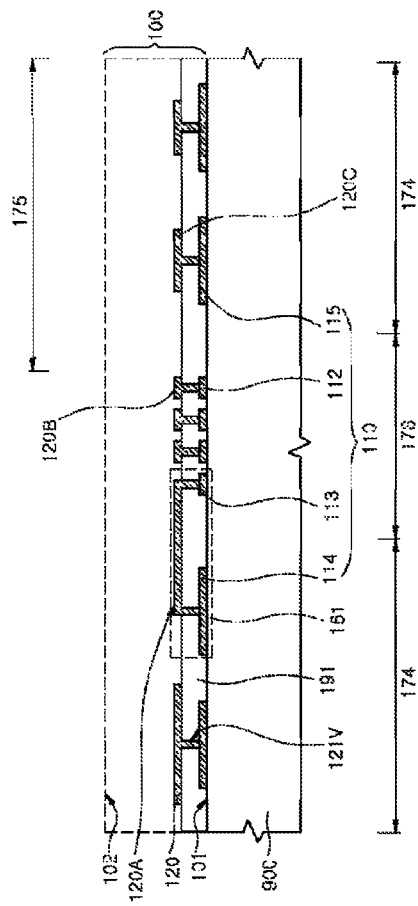
Figure 4:
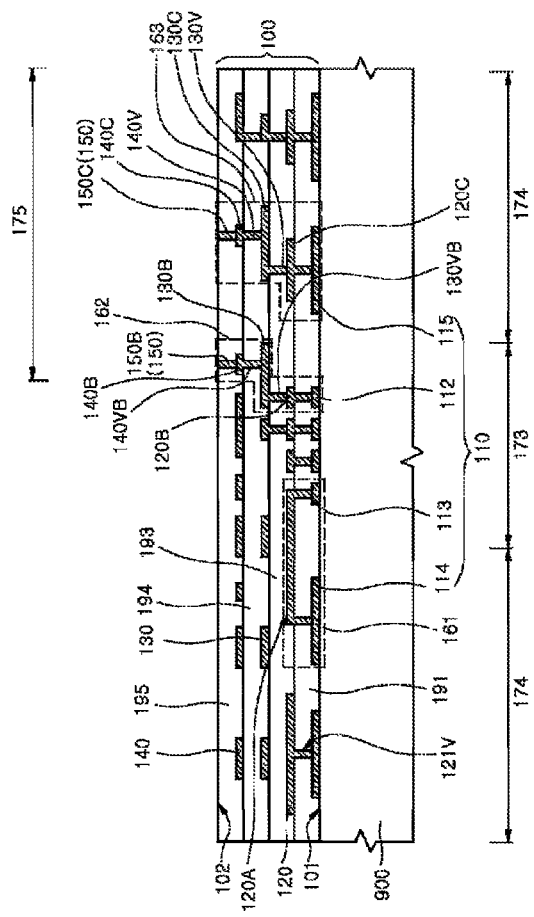

FIGS. 2 to 4 are enlarged views illustrating a portion of the interconnection structure layer 100 and illustrating a step of forming the interconnection structure layer 100. As illustrated in FIG. 2, first outer conductive trace patterns 110 may be formed on the first surface 901 of the dummy wafer 900. Specifically, a conductive layer such as a metal layer may be formed on the first surface 901 of the dummy wafer 900, and the conductive layer may be patterned using a photolithography process and an etch process to form the first outer conductive trace patterns 110. The first outer conductive trace patterns 110 may be formed of a copper (Cu) layer or an aluminum (Al) layer.

The first outer conductive trace patterns 110 may correspond to some of the interconnection lines included in the interconnection structure layer 100. The first outer conductive trace patterns 110 may be formed to have connecting pad shapes. The first outer conductive trace patterns 110 may include first patterns 112 and second patterns 113 having substantially the same shape as the first patterns 112. The first and second patterns 112 and 113 of the first outer conductive trace patterns 110 may be connected to a first semiconductor device which is disposed later. The first and second patterns 112 and 113 of the first outer conductive trace patterns 110 may be formed in the first region 173 of the first surface 101 of the interconnection structure layer 100. The first outer conductive trace patterns 110 may further include third patterns 114 and fourth patterns 115 having substantially the same shape as the third patterns 114. The third and fourth patterns 114 and 115 of the first outer conductive trace patterns 110 may be connected to outer connectors such as solder balls which are disposed later. The third and fourth patterns 114 and 115 of the first outer conductive trace patterns 110 may be formed in the second regions 174 of the first surface 101 of the interconnection structure layer 100.

The third and fourth patterns 114 and 115 of the first outer conductive trace patterns 110 may be formed to have a pitch (or a width) which is greater than a pitch (or a width) of the first and second patterns 112 and 113 of the first outer conductive trace patterns 110. Even though a pitch of the third and fourth patterns 114 and 115 is different from a pitch of the first and second patterns 112 and 113, all of the first outer conductive trace patterns 110 may be patterned to have relatively finer pitches compared with printed circuit patterns that are formed on a general printed circuit board (PCB) because a surface flatness of the dummy wafer 900 is better than that of the PCB.

As illustrated in FIG. 3, a first dielectric layer 191 may be formed on the first surface 901 of the dummy wafer 900 to cover and insulate the first outer conductive trace patterns 110 from each other. The first dielectric layer 191 may be formed to include at least one of various dielectric materials. For example, the first dielectric layer 191 may be formed of an interlayer dielectric (ILD) layer or an inter-metal dielectric (IMD) layer comprised of a silicon oxide layer, a silicon nitride layer, or a polymer layer such as a polyimide layer. The first dielectric layer 191 may be formed using a lamination process, a deposition process or a coating process.

First inner conductive trace patterns 120 may be formed on the first dielectric layer 191. The first inner conductive trace patterns 120 may be formed to provide routes for the first outer conductive trace patterns 110. For example, the first inner conductive trace patterns 120 may be formed to be electrically connected to the first outer conductive trace patterns 110 through vias 121v that substantially penetrate the first dielectric layer 191. A first pattern 120A corresponding to one of the first inner conductive trace patterns 120 may be formed to act as a horizontal interconnection portion 161 electrically connecting the second pattern 113 of the first outer conductive trace patterns 110 to the third pattern 114 of the first outer conductive trace patterns 110.

As illustrated in FIG. 4, a second dielectric layer 193 may be formed on the first dielectric layer 191 to cover and insulate the first inner conductive trace patterns 120 from each other. The second dielectric layer 193 may be formed to include at least one of various dielectric materials. Second inner conductive trace patterns 130 may be formed on the second dielectric layer 193. A first pattern 130B of the second inner conductive trace patterns 130 may be electrically connected to another second pattern 120B of the first inner conductive trace patterns 120 through a via (130VB) that substantially penetrates the second dielectric layer 193. Another second pattern 130C of the second inner conductive trace patterns 130 may be electrically connected to a third pattern 120C of the first inner conductive trace patterns 120 through another via (130V) that substantially penetrates the second dielectric layer 193.

A third dielectric layer 194 may be formed on the second dielectric layer 193 to cover and insulate the second inner conductive trace patterns 130 from each other. The third dielectric layer 194 may be formed to include at least one of various dielectric materials. Third inner conductive trace patterns 140 may be formed on the third dielectric layer 194.). A first pattern 140B of the third inner conductive trace patterns 140 may be formed to be electrically connected to the first pattern 130B of the second inner conductive trace patterns 130 through a via 140VB that substantially penetrates the third dielectric layer 194. Another second pattern 140C of the third inner conductive trace patterns 140 may be electrically connected to the second pattern 130C of the second inner conductive trace patterns 130 through another via 140V that substantially penetrates the third dielectric layer 194.

A fourth dielectric layer 195 may be formed on the third dielectric layer 194 to cover and insulate the third inner conductive trace patterns 140 from each other. The fourth dielectric layer 195 may be formed to include at least one of various dielectric materials. Second outer conductive trace patterns 150 may be formed to penetrate the fourth dielectric layer 195. The second outer conductive trace patterns 150 may be electrically connected to some of the third inner conductive trace patterns 140, respectively. A first pattern 150B of the second outer conductive trace patterns 150 may be electrically connected to the first pattern 140B of the third inner conductive trace patterns 140. The conductive trace patterns including the first pattern 150B of the second outer conductive trace patterns 150, the first pattern 140B of the third inner conductive trace patterns 140, the first pattern 130B of the second inner conductive trace patterns 130, the first pattern 120B of the first inner conductive trace patterns 120, and the first pattern 112 of the first outer conductive trace patterns 110 may constitute a first vertical interconnection portion 162.

Another second pattern 150C of the second outer conductive trace patterns 150 may be electrically connected to the second pattern 140C of the third inner conductive trace patterns 140. The second pattern 150C of the second outer conductive trace patterns 150, the second pattern 140C of the third inner conductive trace patterns 140, the second pattern 130C of the second inner conductive trace patterns 130, the second pattern 120C of the first inner conductive trace patterns 120, and the fourth pattern 115 of the first outer conductive trace patterns 110 may constitute a second vertical interconnection portion 163.

The first to fourth dielectric layers 191, 193, 194 and 195 may constitute a body portion of the interconnection structure layer 100 that insulates the trace patterns 110, 120, 130, 140 and 150 from each other.

Figure 5:
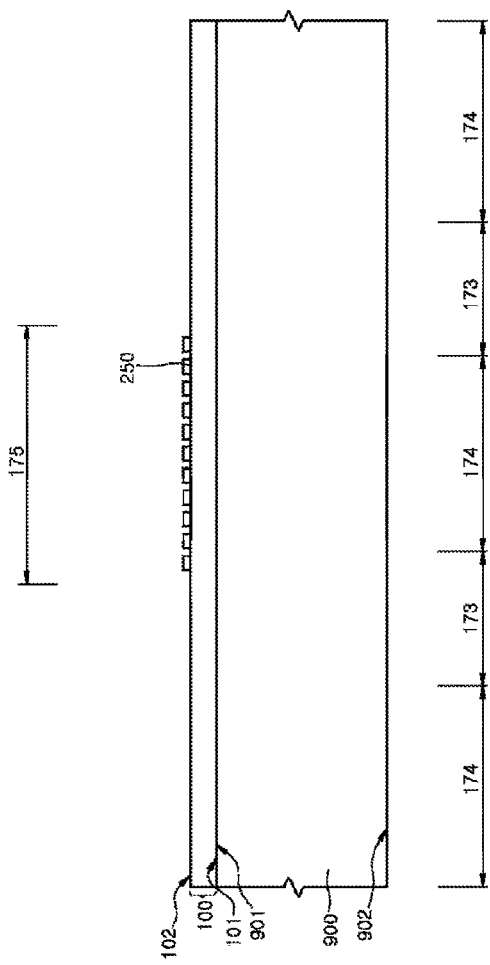
Figure 6:
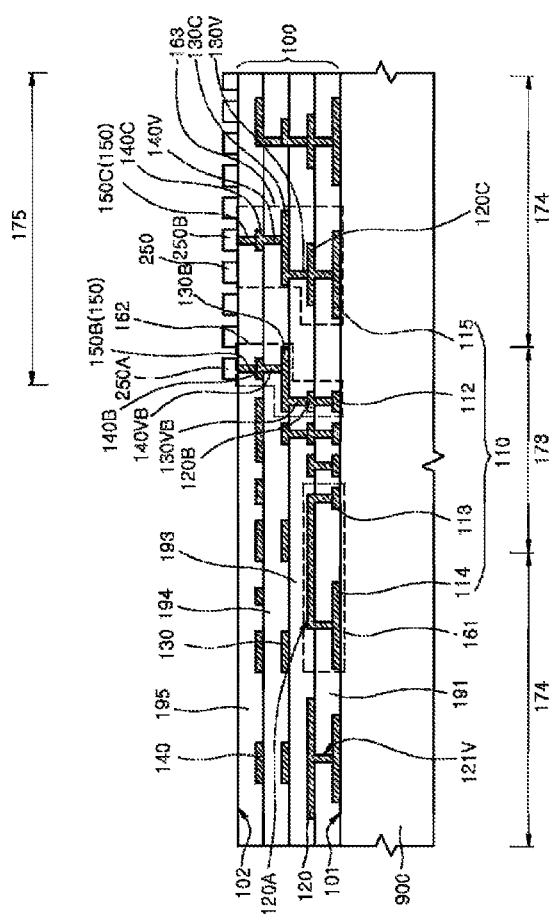

FIG. 5 illustrates a step of forming first bump pads 250 on the second surface 102 of the interconnection structure layer 100, and FIG. 6 is an enlarged view of a portion of the interconnection structure layer 100 shown in FIG. 5. As illustrated in FIGS. 5 and 6, first bump pads 250 may be formed on the interconnection structure layer 100. The first bump pads 250 may be formed to overlap with the third region 175 on which the second semiconductor device will be disposed. The first bump pads 250 may be pads on which connectors such as bumps are later landed. The first bump pads 250 may be formed to overlap the second outer conductive trace patterns 150, respectively. The first bump pads 250 may be electrically connected to the second outer conductive trace patterns 150, respectively. A pad 250A of the first bump pads 250 may be electrically connected to the first vertical interconnection portion 162, and another pad 250B of the first bump pads 250 may be electrically connected to the second vertical interconnection portion 163. The first bump pads 250 may be formed using a plating process. The first bump pads 250 may be formed to include copper (Cu).

Figure 7:
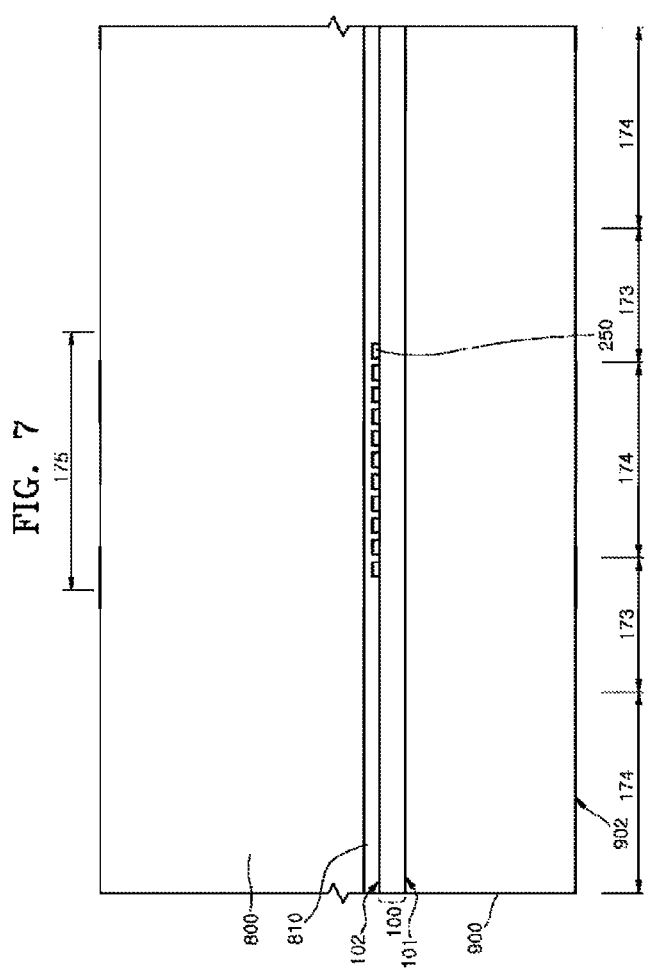

FIG. 7 is a cross-sectional view illustrating a step of attaching a carrier wafer 800 to the interconnection structure layer 100. The carrier wafer 800 may be attached to the second surface 102 of the interconnection structure layer 100 opposite to the dummy wafer 900 using a temporary adhesive layer 810 to protect the first bump pads 250. The first bump pads 250 may be formed on the second surface 102 of the interconnection structure layer 100 before the carrier wafer 800 is attached to the second surface 102 of the interconnection structure layer 100. The carrier wafer 800 may act as a supporter for handling the interconnection structure layer 100 in subsequent processes.

Figure 8:
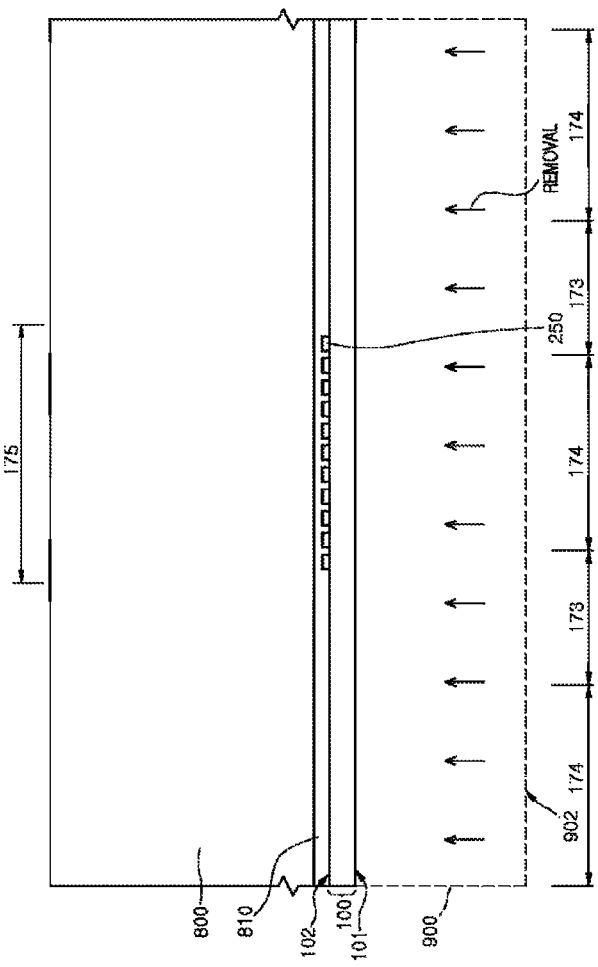

FIG. 8 is a cross-sectional view illustrating a step of exposing the first surface 101 of the interconnection structure layer 100. Specifically, the dummy wafer 900 may be removed from the interconnection structure layer 100 to expose the first surface 101 of the interconnection structure layer 100. More specifically, the second surface 902 of the dummy wafer 900 may be back ground to reduce a thickness of the dummy wafer 900, which may recess the dummy wafer 900. Moreover, the remaining portion of the dummy wafer 900 may be further etched to expose the first surface 101 of the interconnection structure layer 100. As a result, the interconnection structure layer 100 may be separated from the dummy wafer 900 by grinding and etching the dummy wafer 900.

Figure 9:
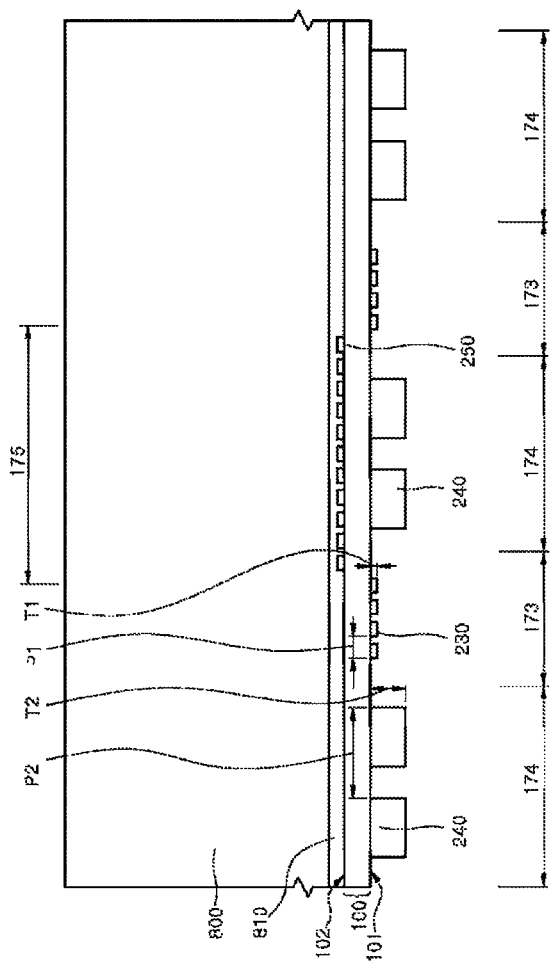
Figure 10:
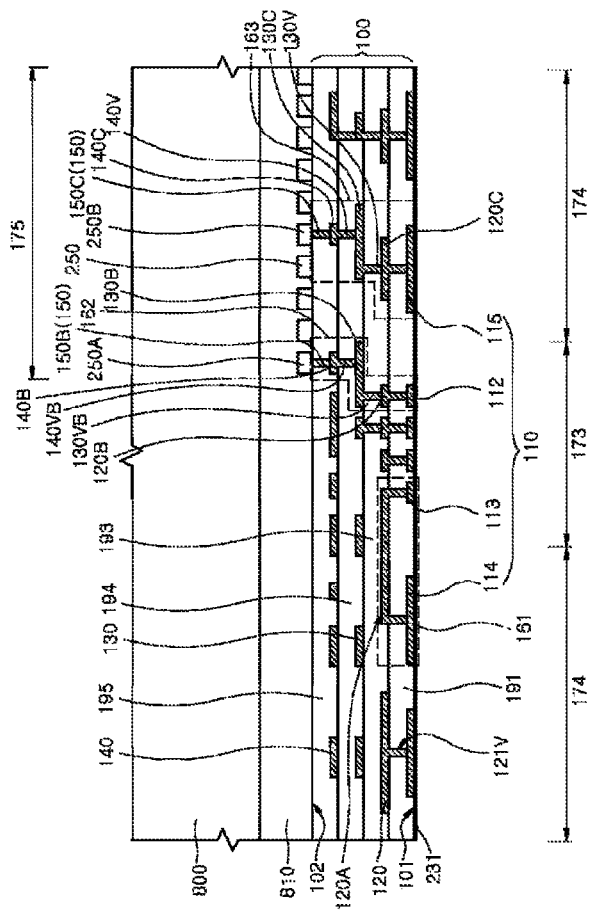

FIG. 9 is a cross-sectional view illustrating a step of forming second bump pads 230 and elevated pads 240 on the first surface 101 of the interconnection structure layer 100, and FIGS. 10 to 17 are enlarged views of a portion of the interconnection structure layer 100 shown in FIG. 10. As illustrated in FIG. 9, the second bump pads 230 may be formed in the first region 173 of the first surface 101 of the interconnection structure layer 100, on which the first semiconductor device will be disposed. The second bump pads 250 may be conductive connectors to be connected to the first semiconductor device. The second bump pads 230 may be arranged into different groups. Each group of the second bump pads 230 may be located in each of first regions 173 so that each of the semiconductor devices is disposed in each of first regions 173, respectively. A connector such as a bump may be later landed on and bonded to the second bump pad 230. The elevated pads 240 may be formed in second regions 174 on the first surface 101 of the interconnection structure layer 100. Each of the elevated pads 240 may be formed to include a solder layer. An outer connector such as a solder ball may be landed on and bonded to the elevated pad 240. The elevated pads 240 may be arranged into different groups on either side of the second bump pad 230.

The elevated bump pads 240 may be formed to have a pitch which is different from a pitch of the second bump pads 230. For example, the elevated bump pads 240 may be formed to have a pitch which is greater than a pitch of the second bump pads 230. The elevated bump pads 240 may be formed of a conductive layer having a thickness which is different from a thickness of the second bump pads 230. The elevated pads 240 may have a thickness T2 greater than a thickness T1 of the second bump pads 230 so that a height of the elevated pads 240 is higher than a height of the second bump pads 230 on the first surface 101 of the interconnection structure layer 100. The thickness T1 of the second bump pads 230 may be around 5 µm. The thickness T1 of the second bump pads 230 may be set to a thickness of no more than 5 µm. By comparison, the thickness T2 of the elevated pads 240 may be around 10 µm. The thickness T2 of the elevated pads 240 may be set to a thickness of more than 10 µm. The elevated pads 240 and the second bump pads 230 may be formed by various processes. For example, the elevated pads 240 and the second bump pads 230 may be formed by a selective plating process with a plating resist pattern.

As illustrated in FIG. 10, a seed layer 231 may be formed on the first surface 101 of the interconnection structure layer 100. A metal layer may be deposited directly on the first surface 101 to form the seed layer 231. The seed layer 231 may be formed to include a multi-layered metal layer comprised of a titanium (Ti) layer and a copper (Cu) layer. The seed layer 231 may be extended to cover the first and second regions 174 and 173 of the first surface 101.

Figure 11:
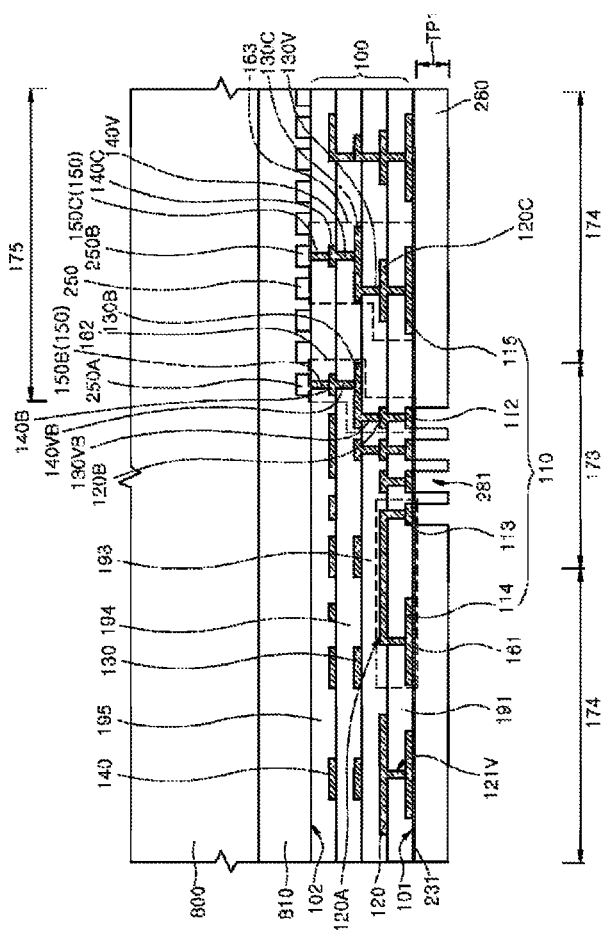

As illustrated in FIG. 11, a first resist pattern 280 may be formed on the seed layer 231. The first resist pattern 280 may be formed to have first openings 281. Each of the first openings 281 may expose a portion of the seed layer 231 on which the second bump pads (230 of FIG. 9) may be formed. The first openings 281 open portions of the seed layer 231 overlapped with the first and second patterns 112 and 113 of the first outer conductive trace patterns 110, respectively. The first openings 281 may also expose regions of the elevated pads (240 of FIG. 9) located on the first surface 101 of the interconnection structure layer 100. The first resist pattern 280 may be used as a plating resist pattern in selective plating process. The first resist pattern 280 may be formed of a photoresist material. A thickness TP1 of the first resist pattern 280 may be set depending on the thickness T1 of the second bump pad (230 of FIG. 9).

Figure 12:
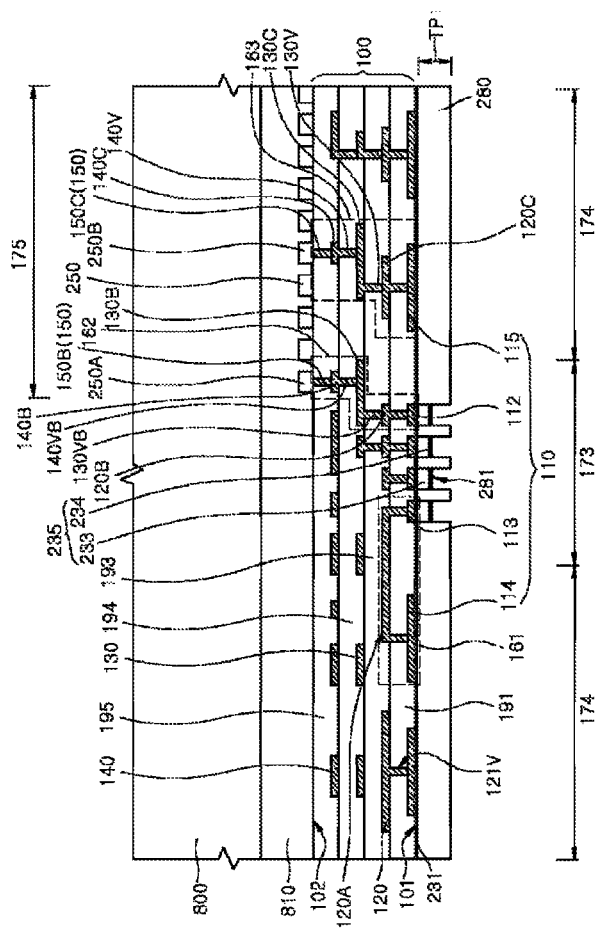

As illustrated in FIG. 12, a first body layer 233 and a first capping layer 234 of the second bump pad (230 of FIG. 9) are formed in the first opening 281 of the first resist pattern 280. Copper electroplating may be performed using a copper plating solution on a portion of the seed layer 231 exposed by the first opening 281 of the first resist pattern 280. A copper layer of the first body layer 233 may be selectively plated to be grown in the first opening 281. The first capping layer 234 may be plated on the grown first body layer 233. The first capping layer 234 may include a nickel (Ni) layer, a gold (Au) layer, or a multilayer of Ni and Au. The first body layer 233 and the first capping layer 234 in the first opening 281 may be regarded as a preliminary pattern 235 for the second bump pad 230.

Figure 13:
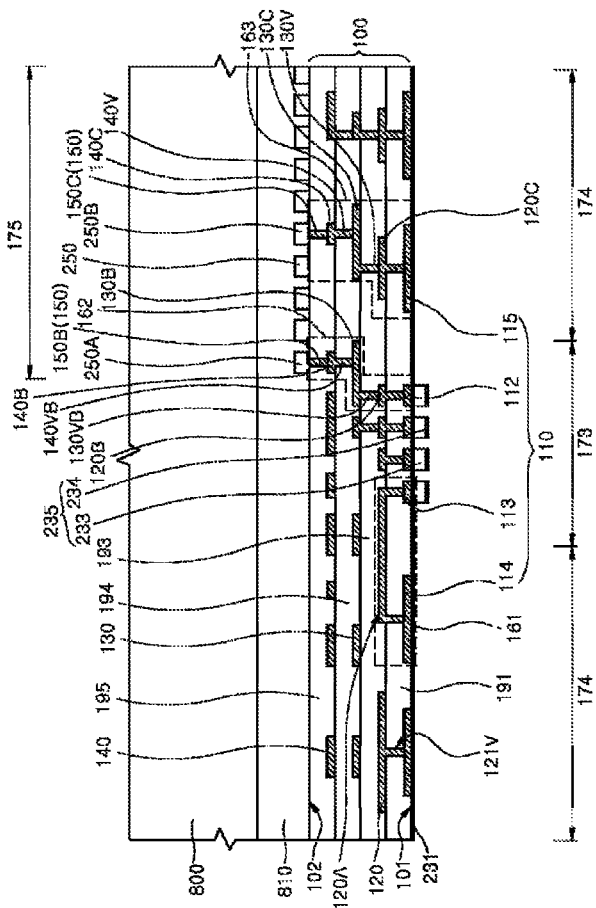

As illustrated in FIG. 13, the first resist pattern (280 of FIG. 12) is selectively removed to expose another portion of the seed layer 231 beside the preliminary pattern 235 for the second bump pad (230 of FIG. 9).

Figure 14:
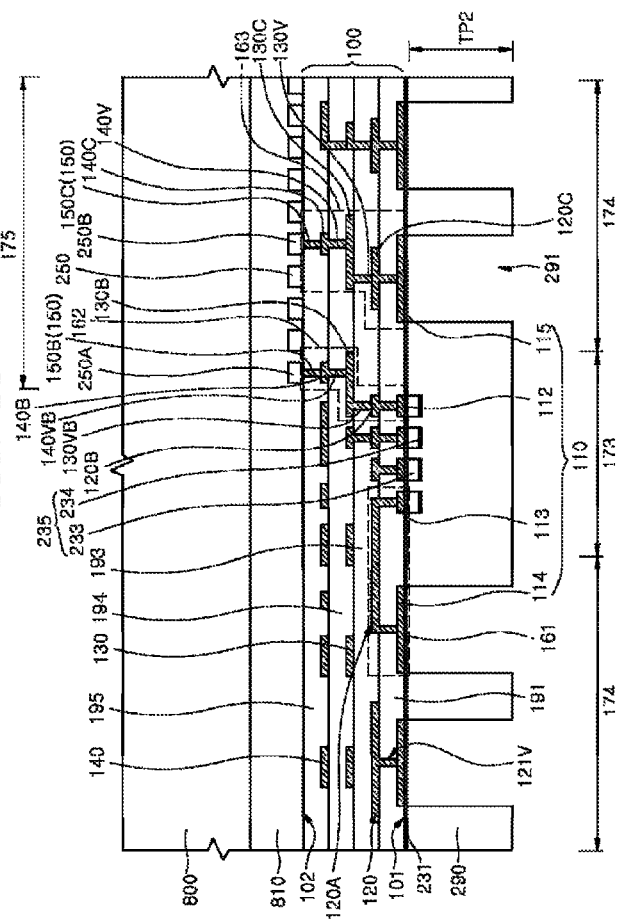

As illustrated in FIG. 14, a second resist pattern 290 may be formed on the seed layer 231. The second resist pattern 290 may be formed to have second openings 291. Each of the second openings 291 may expose another portion of the seed layer 231 on which the elevated pads (240 of FIG. 9) may be formed. The second openings 291 open portions of the seed layer 231 overlapped with the third and fourth patterns 114 and 115 of the first outer conductive trace patterns 110, respectively. The second resist pattern 290 may be used as a plating resist pattern in selective a plating process. The second resist pattern 290 may be formed of a photoresist material. A thickness TP2 of the second resist pattern 290 may be set depending on the thickness (T2 of FIG. 9) of the elevated pad (240 of FIG. 9). The thickness TP2 of the second resist pattern 290 may be thicker than the thickness TP1 of the first resist pattern (280 of FIG. 11).

Figure 15:
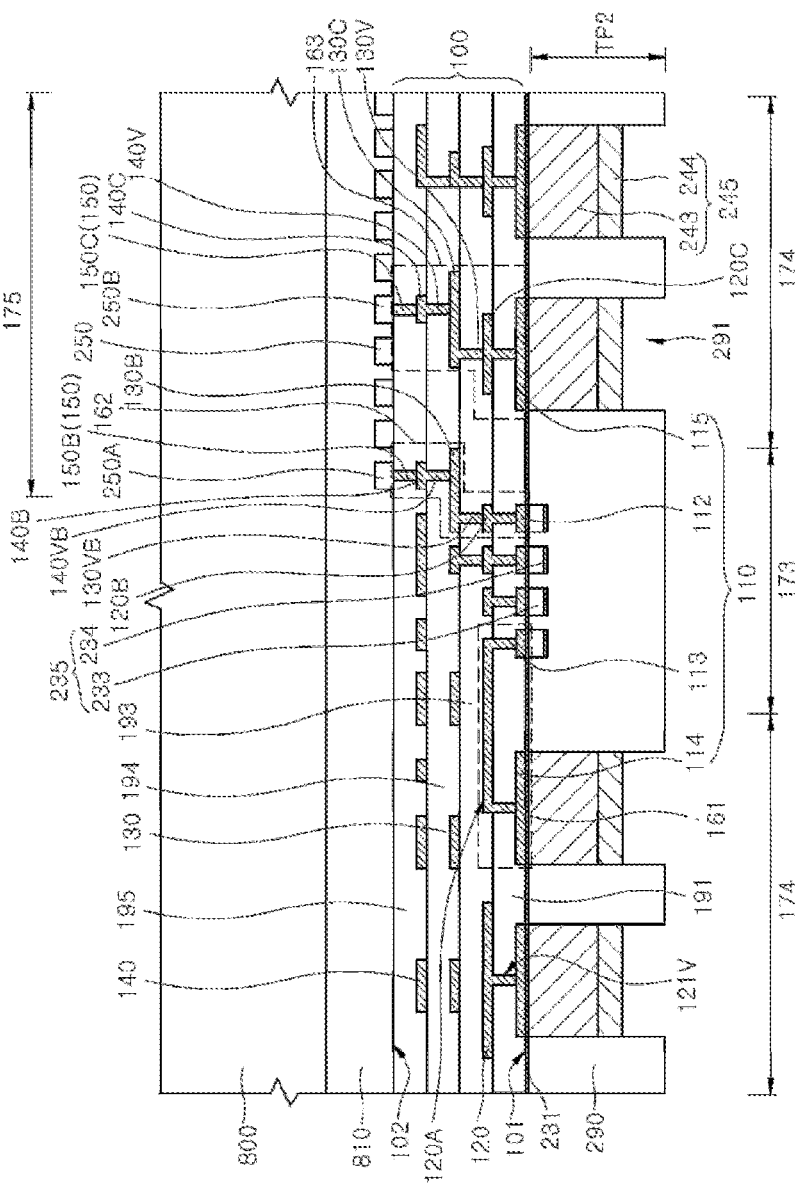

As illustrated in FIG. 15, a second body layer 243 and a second capping layer 244 of the elevated pad (240 of FIG. 9) are formed in the second opening 291 of the second resist pattern 290. Another copper electroplating may be performed using another copper plating solution on a portion of the seed layer 231 exposed by the second opening 291 of the second resist pattern 290. Another copper layer of the second body layer 243 may be selectively plated to be grown in the second opening 291. A thickness of the second body layer 243 is thicker than the thickness of the first body layer 233. The second capping layer 244 may be plated on the grown second body layer 243. The second capping layer 244 may be formed to include a solder layer. In one example, the second capping layer 244 may be formed as a solder of tin-silver alloy solder. The second body layer 243 and the second capping layer 244 in the second opening 291 may be regarded as a preliminary pattern 245 for the elevated pad (240 of FIG. 9).

The preliminary pattern 235 for the second bump pad (230 of FIG. 9) may be covered by the second resist pattern 290 to be protected from the preliminary pattern 245 forming process. As the preliminary pattern 235 for the second bump pad (230 of FIG. 9) may be isolated from the plating the preliminary pattern 245 for the elevated pad (240 of FIG. 9), the preliminary pattern 245 may have a different thickness and a different height from the thickness and the height of the preliminary pattern 235.

Figure 16:
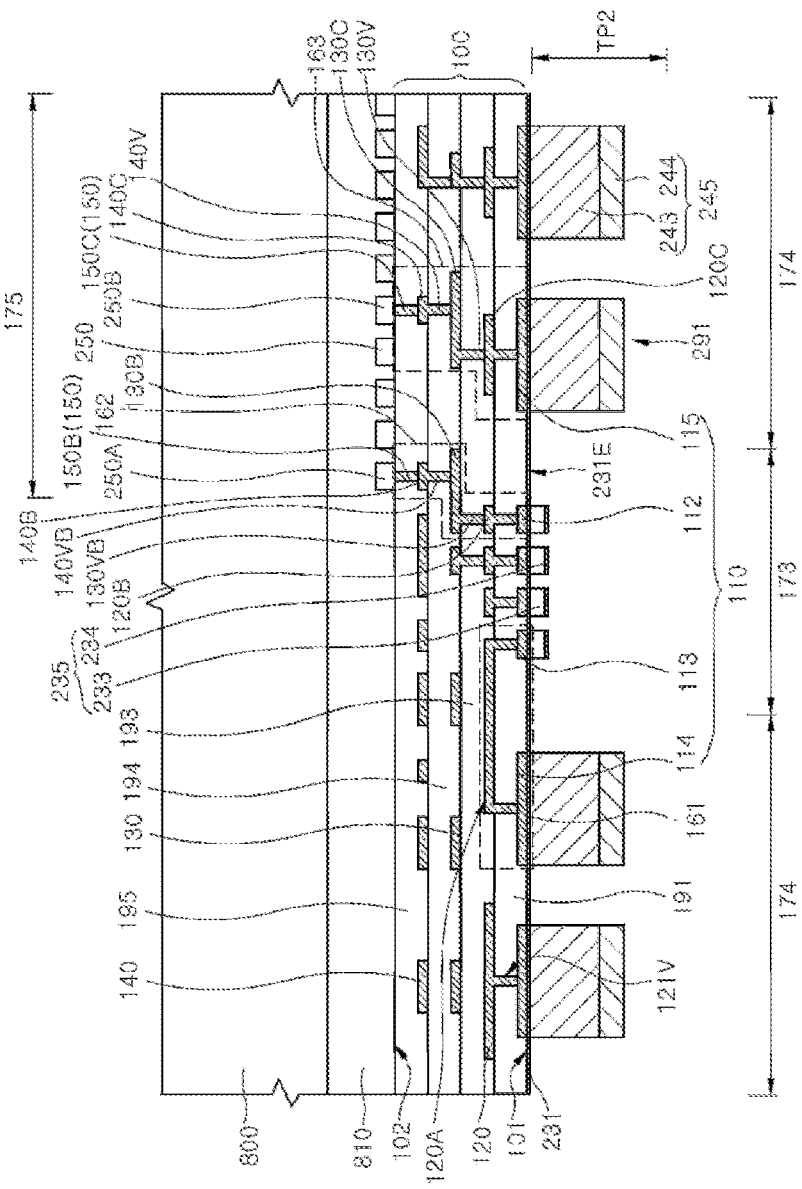

As illustrated in FIG. 16, the second resist pattern (290 of FIG. 15) is selectively removed to expose the preliminary patterns 235 and 245. The preliminary patterns 235 and 245 expose portions 231E of the seed layer 231.

Figure 17:
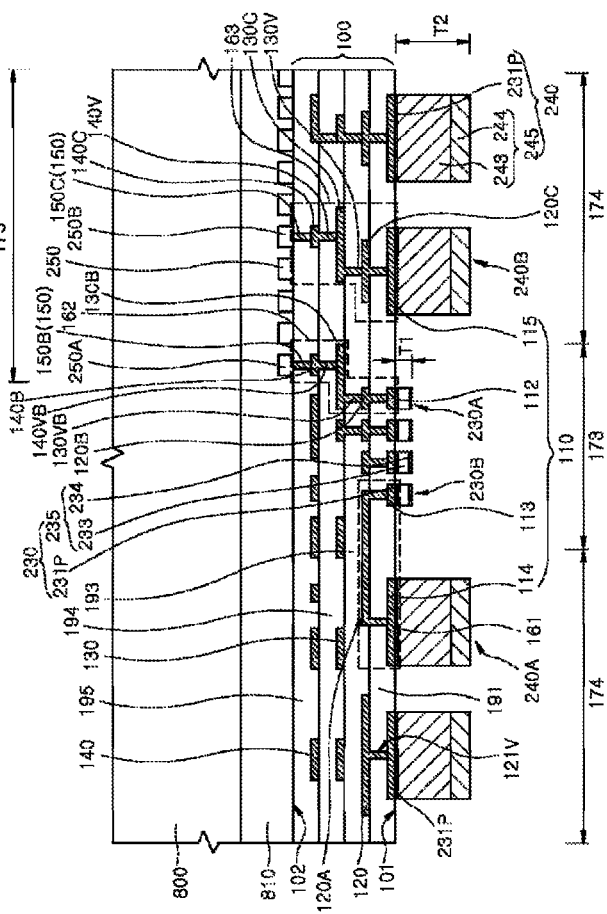

As illustrated in FIG. 17, the second bump pads 230 and the elevated pads 240 may be formed. The exposed portions 231E of the seed layer 231 may be selectively removed by an etching process. Seed patterns 231P overlapping with the preliminary patterns 235 and 245 are separated from each other. A stack of the seed pattern 231P and the preliminary pattern 235 may form the second bump pad 230, and another stack of the seed pattern 231P and the preliminary pattern 245 may form the elevated pad 240.

Figure 18:
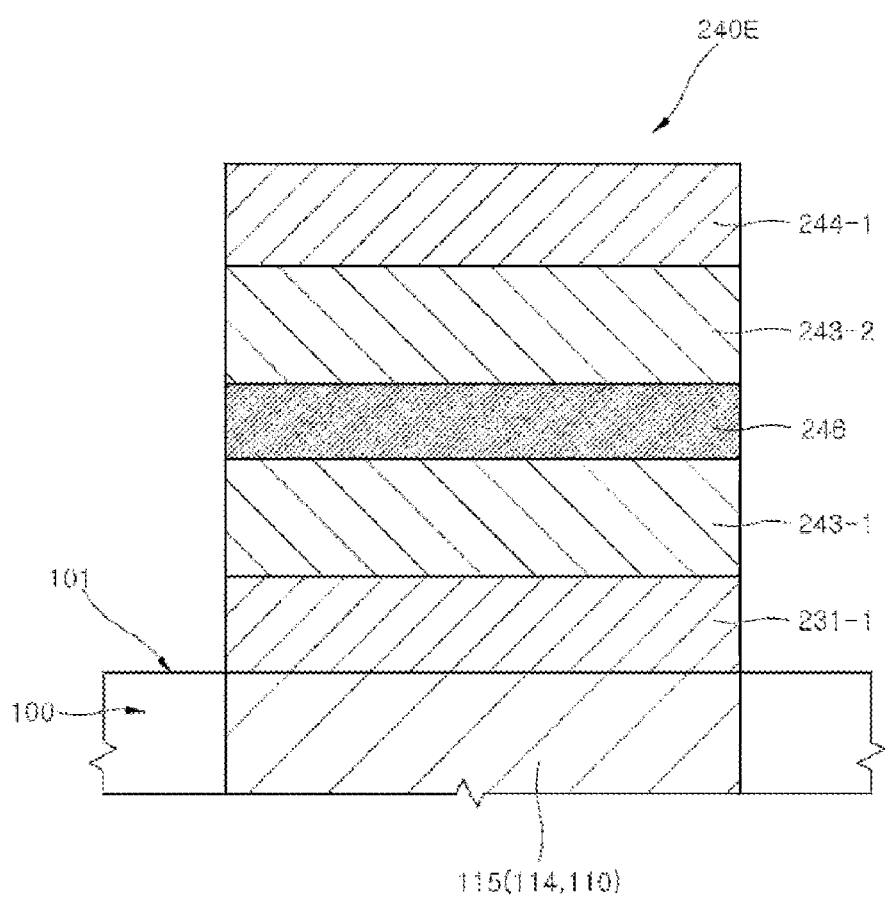

FIG. 18 is a cross-sectional view illustrating a structured of an elevated pad 240E according to some embodiments. The elevated pad 240E may include more conductive layers to be thicker. The elevated pad 240E may be formed to have a sequentially stacked structure of a seed pattern 231-1, a second body layer 243-1, a third body layer 246, a fourth body layer 243-2 and a second capping layer 244-1. The second body layer 243-1 may include a copper plating layer. The third body layer 246 may be an intermediate layer and may include a nickel (Ni) layer. The fourth body layer 243-2 may include another copper plating layer. As the elevated pad 240E includes multiple body layers of the second body layer 243-1, the third body layer 246 and the fourth body layer 243-2, the thickness of the elevated pad 240E is thicker than the thickness of the elevated pad 240 of FIG. 17.

Referring to FIG. 17, the second bump pads 230 may be electrically connected to the first and second patterns 112 and 113 of the first outer conductive trace patterns 110, respectively. One pad 230A of the second bump pads 230 may be electrically connected to the first vertical interconnection portion 162, and another pad 230B of the second bump pads 230 may be electrically connected to the horizontal interconnection portion 161. The elevated pads 240 may be electrically connected to the third and fourth patterns 114 and 115 of the first outer conductive trace patterns 110, respectively. One pad 240A of the elevated pads 240 may be electrically connected to the horizontal interconnection portion 161, and another pad 240B of the elevated pads 240 may be electrically connected to the second vertical interconnection portion 163.

Figure 19:
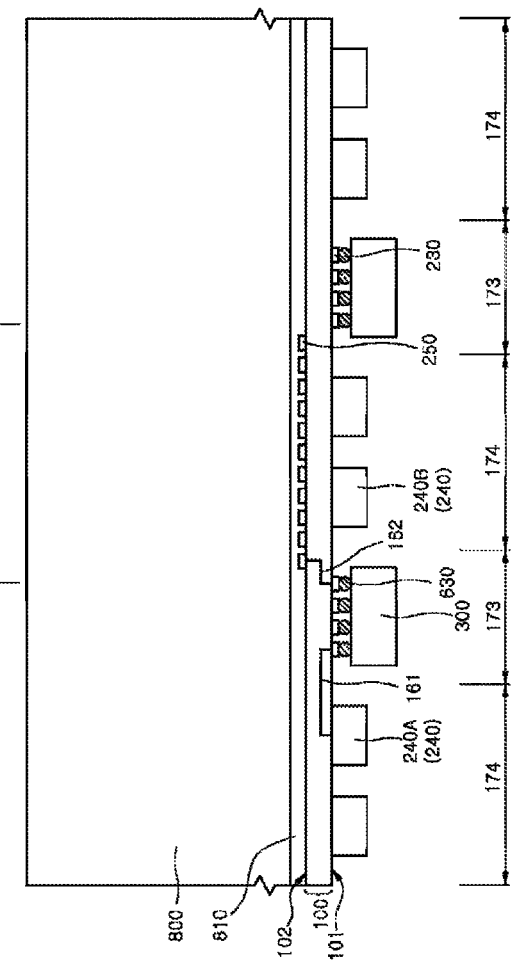

FIG. 19 is a cross-sectional view illustrating a step of disposing first semiconductor devices 300 on the first surface 101 of the interconnection structure layer 100. The first semiconductor devices 300 may be disposed connected to the second bump pads 230 through first chip connectors 630. The first chip connectors 630 may be conductive connection members such as micro-bumps. For example, one of the first semiconductor devices 300 may be electrically connected to the one pad 240A of the elevated pads 240 through one of the first chip connectors 630, one (230B of FIG. 17) of the second bump pads 230, and the horizontal interconnection portion (161 of FIG. 17). The horizontal interconnection portion (161 of FIG. 17) may be comprised of one of the second patterns (113 of FIG. 17) of the first outer conductive trace patterns (110 of FIG. 17), the first pattern (120A of FIG. 17) of the first inner conductive trace patterns (120 of FIG. 17), and one of the third patterns (114 of FIG. 17) of the first outer conductive trace patterns (110 of FIG. 17). At least one of the first semiconductor devices 300 may be electrically connected to one (250A of FIG. 17) or more pads of the first bump pads 250. At least one of the first semiconductor devices 300 may be electrically connected to one (250A of FIG. 17) or more pads of the first bump pads 250 through another of the first chip connectors 630, another (230A of FIG. 17) of the second bump pads 230, and the first vertical interconnection portion (162 of FIG. 17). The first semiconductor devices 300 may be memory devices. For example, the first semiconductor devices 300 may be DRAM devices.

Figure 20:
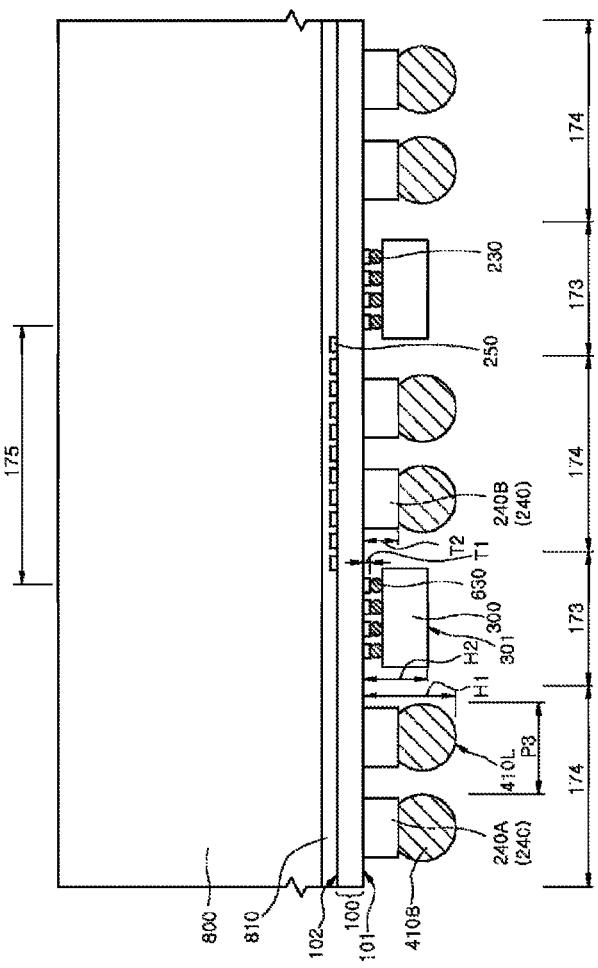

FIG. 20 is a cross-sectional view illustrating a step of disposing through mold ball connectors (TMBCs) 410B on the first surface 101 of the interconnection structure layer 100. Specifically, the TMBCs 410B may be connected to the elevated pads 240, respectively. The elevated pad 240 may act as stress buffer because the thickness of the elevated pad 240 is thicker than the thickness of the second bump pad 230. The elevated pad 240 has the second capping layer (244 of FIG. 17). The TMBC 410B may be bonded and fixed on the elevated pad 240 by the capping layer 244.

The TMBCs 410B may possibly not include any solder material. Each of the TMBCs 410B may be a solderless metal ball, for example, a solderless copper ball. A solder ball containing tin (Sn) may have a relatively low melting point of about 220 degrees Celsius. Thus, tin (Sn) based solder balls may be inappropriate for the TMBCs 410B. Copper balls may have a melting point which is higher than a melting point of tin (Sn) based solder balls. Thus, copper balls may be appropriate for the TMBCs 410B. In addition, copper balls may have an electrical conductivity which is higher than an electrical conductivity of tin (Sn) based solder balls. Thus, copper balls may be more appropriate for the TMBCs 410B. The copper balls may be picked and placed on the elevated pads 240, respectively. Subsequently, copper balls may be bonded to the elevated pads 240 using a solder reflow process to provide the TMBCs 410B attached to the elevated pads 240. The second capping layers (244 of FIG. 17) of the elevated pads 240 may be reflowed to bond the TMBCs 410B on the elevated pads 240.

A height H1 of the TMBCs 410B and the elevated pad 240 from the first surface 101 of the interconnection structure layer 100 may be greater than a height H2 of the first semiconductor devices 300 mounted on the second bump pads 230. The thickness of the elevated pad 240 and a diameter size of the TMBC 410B provide the height H1. Thus, the diameter size of the TMBC 410B may be a smaller size than the size of the overall stacked structure height H1. While the diameter of the TMBC 410B is maintained relatively small, a position of the TMBC 410B may be elevated by the thickness T2 of the elevated pad 240.

While the height H1 of the TMBC 410B and the elevated pad 240 is higher than the height H2, it is possible to reduce the diameter of the TMBC 410B. Thus, it is possible to reduce a pitch P3 between the TMBCs 410B. While the diameter size of the TMBC 410B is reduced, the height H1 of the TMBC 410B and the elevated pad 240 can be higher than the height H2 of the first semiconductor device 300.

The lower ends 410L of the TMBCs 410B may be located at a level which is lower than surfaces 301 of the first semiconductor devices 300. That is, the TMBCs 410B may downwardly protrude from the first semiconductor devices 300.

Figure 21:
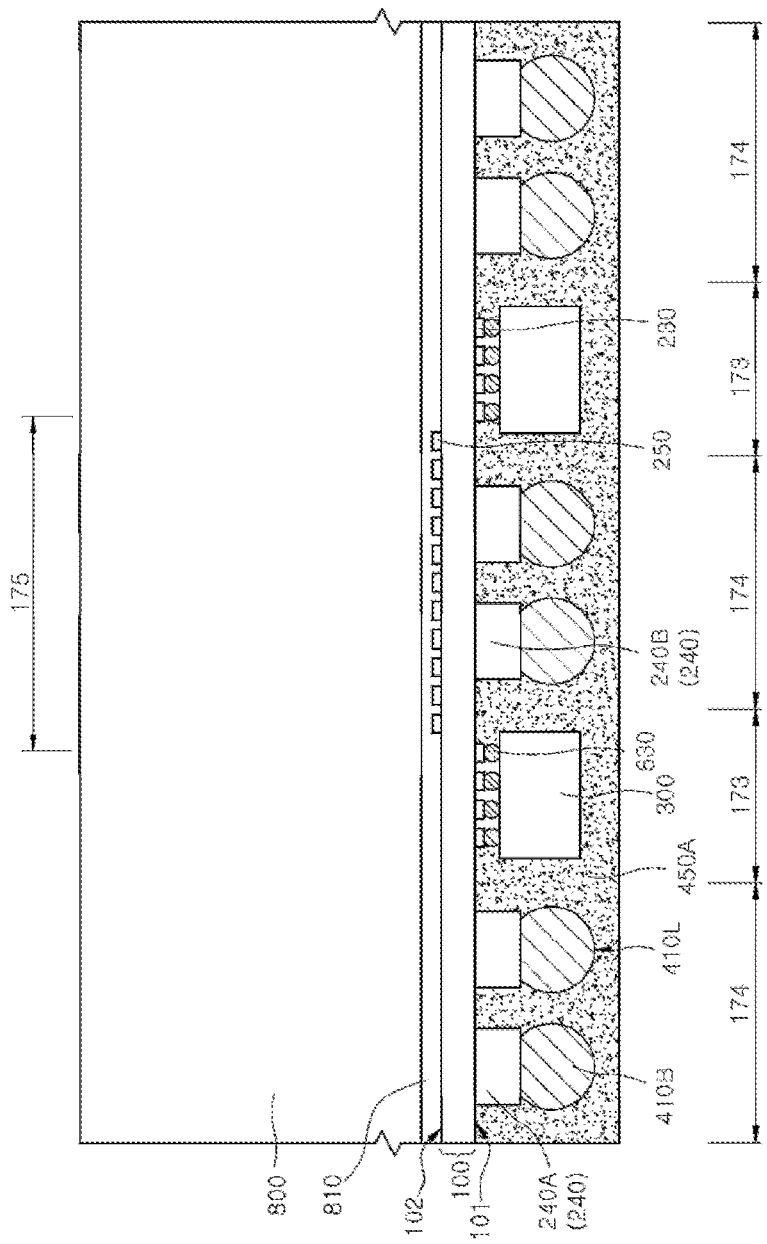

FIG. 21 is a cross-sectional view illustrating a step of forming a molding material 450A on the first surface 101 of the interconnection structure layer 100. The molding material 450A may be molded using a wafer molding process to cover the TMBCs 410B and the first semiconductor devices 300 disposed on the first surface 101 of the interconnection structure layer 100. The molding material 450A may be formed of a molding member such as an epoxy molding compound (EMC) material. For example, the EMC material may be heated up to a molding temperature of about 180 degrees Celsius to provide a liquid EMC material, and the liquid EMC material may be coated and molded on the first surface 101 of the interconnection structure layer 100 to cover the TMBCs 410B and the first semiconductor devices 300.

The molded EMC material may be cured by a post mold curing process to form the molding material 450A. The post mold curing process may be performed at a curing temperature of about 175 degrees Celsius, which is lower than the molding temperature. Since the copper balls of the TMBCs 410B have a melting point which is higher than the molding temperature and the curing temperature of the molding material 450A, the TMBCs 410B may not be transformed even though the molding process and the post mold curing process are performed on the molding material 450A. General tin (Sn) based solder balls may have a relatively low melting point. Thus, if the TMBCs 410B are formed of the tin (Sn) based solder balls and not using the copper balls, the TMBCs may be transformed during the molding process and the post mold curing process. Accordingly, the TMBCs 410B should be formed using copper balls instead of tin (Sn) based solder balls to provide stable ball connectors.

The elevated pad 240 may have a relatively thick layer to elevate the TMBCs 410B. The EMC portions of the molding material 450A surrounding the elevated pads 240 may be contracted or expanded according to external environments in the molding process or after the molding process. The thick elevated pads 240 may act as stress buffers to the contraction or the expansion of the EMC. As the elevated pads 240 can act effectively as stress buffers, the elevated pads 240 may be prevent stress due to the contraction or the expansion of the EMC which may be transferred to the trace patterns (120, 130 and 140 of FIG. 17) of the interconnection structure layer 100. Thus, defects such as cracks due to stress can be effectively prevented or suppressed in the interconnection structure layer 100.

Figure 22:
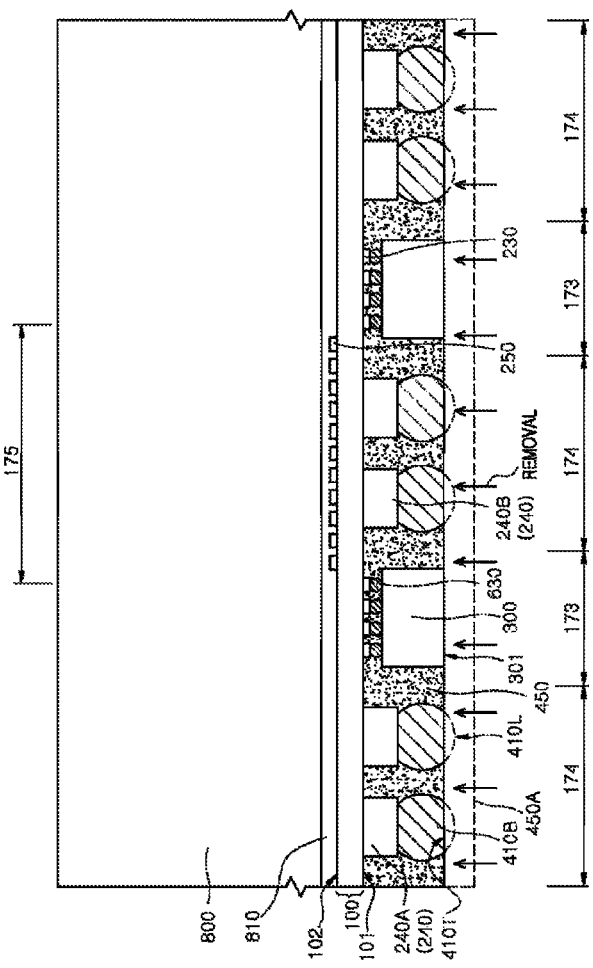

FIG. 22 is a cross-sectional view illustrating a step of exposing surfaces 410T of the TMBCs 410B. Specifically, the molding material 450A may be recessed to form a molding layer 450 on the first surface 101 of the interconnection structure layer 100 exposing a portion of each of the TMBCs 410B, and the exposed portions of the TMBCs 410B may be removed to provide flat surfaces 410T of the TMBCs 410B. The molding material 450A may be recessed using a grinding process to provide a molding layer 450. In such a case, the lower ends 410L of the TMBCs 410B may be removed during the grinding process. As a result, the surfaces 410T of the TMBCs 410B may be exposed by removing a portion of the molding material 450A. Since the lower ends 410L of the TMBCs 410B are removed while the molding material 450A is recessed, the exposed surfaces 410T of the TMBCs 410B may have a flat surface profile. The molding material 450A may be recessed until the surfaces 301 of the first semiconductor devices 300 are exposed. Since the surfaces 301 of the first semiconductor devices 300 are exposed after the molding material 450A is recessed, heat generated from the first semiconductor devices 300 may be efficiently radiated into an outside space. A surface of the resultant molding layer 450 may be a flat surface that is coplanar with the flat surfaces 410T of the TMBCs 410B and the exposed surfaces 301 of the first semiconductor devices 300. The surface of the resultant molding layer 450 may be at the same height as the flat surfaces 410T and the exposed surfaces 301.

Figure 23:
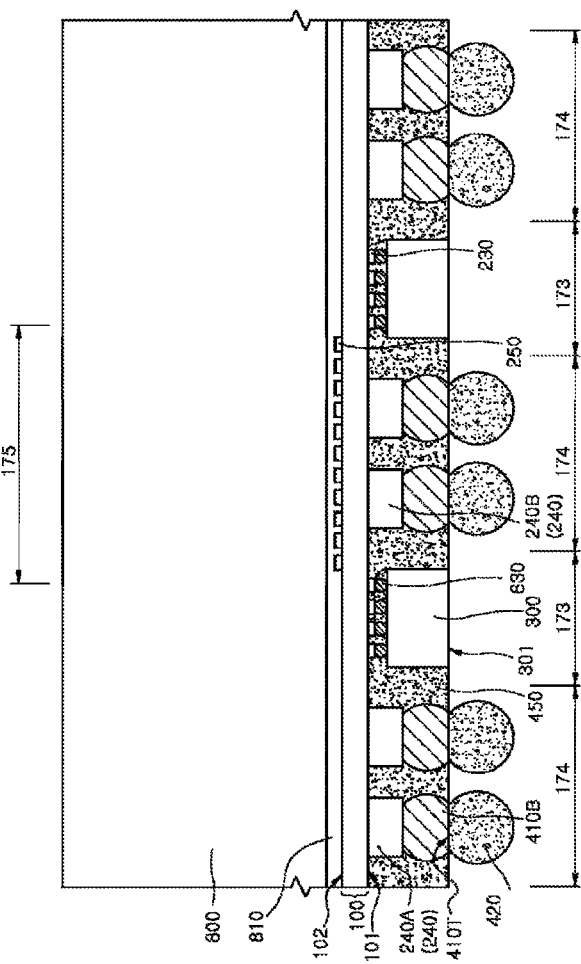

FIG. 23 is a cross-sectional view illustrating a step of forming outer connectors 420 on the TMBCs 410B. The outer connectors 420 may be bonded to the exposed surfaces 410T of the TMBCs 410B, respectively. Each of the outer connectors 420 may have a solder ball shape. The outer connectors 420 may be formed of a tin based solder material including tin (Sn), silver (Ag), and copper (Cu).

Figure 24:
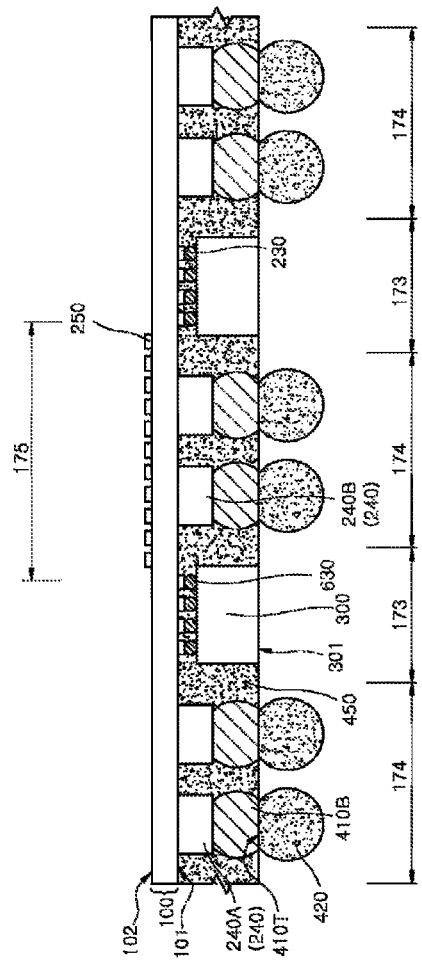

FIG. 24 is a cross-sectional view illustrating a step of detaching the carrier wafer (800 of FIG. 23) from the interconnection structure layer 100. The carrier wafer 800 may be detached from the interconnection structure layer 100 by reducing an adhesive strength of the temporary adhesive layer (810 of FIG. 20). For example, the carrier wafer (800 of FIG. 23) may be detached from the interconnection structure layer 100 by irradiating an ultraviolet (UV) ray onto the temporary adhesive layer (810 of FIG. 20) or by applying heat to the temporary adhesive layer (810 of FIG. 20). If the carrier wafer (800 of FIG. 23) is detached from the interconnection structure layer 100, the second surface 102 of the interconnection structure layer 100, the first bump pads 250, and the first heat spreader bonding pads may be exposed.

Figure 25:
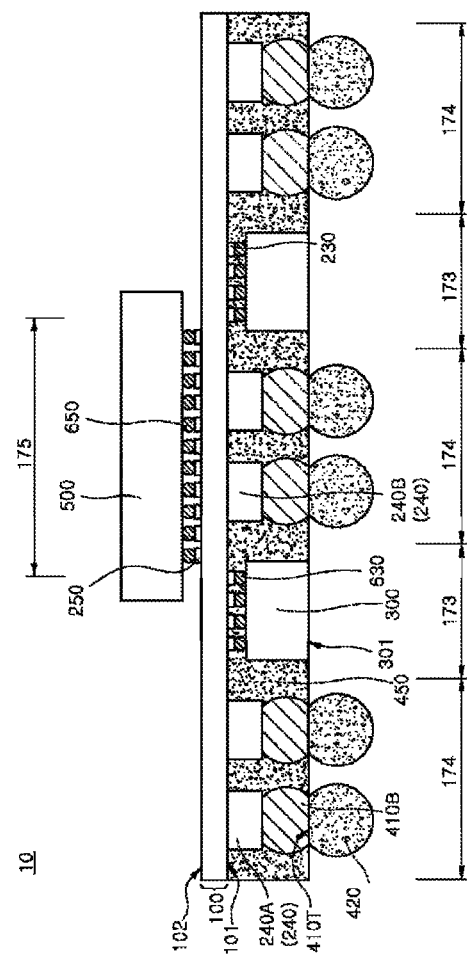

FIG. 25 is a cross-sectional view illustrating a step of disposing a second semiconductor device 500 on the second surface 102 of the interconnection structure layer 100. The second semiconductor device 500 may be bonded to the first bump pads 250 using second chip connectors 650, and the second semiconductor device 500 may comprise a microprocessor. The second chip connectors 650 may include conductive interconnectors such as micro bumps.

Before the second semiconductor device 500 is bonded to the interconnection structure layer 100, the interconnection structure layer 100 and the molding layer 450 may be separated into a plurality of pieces by a die sawing process. The second semiconductor device 500 may be bonded to the first bump pads 250 of any one piece of the interconnection structure layer 100 to provide a semiconductor package 10 including the first and second semiconductor devices 300 and 500 attached to the first and second surfaces 101 and 102 of the interconnection structure layer 100.

Figure 26:
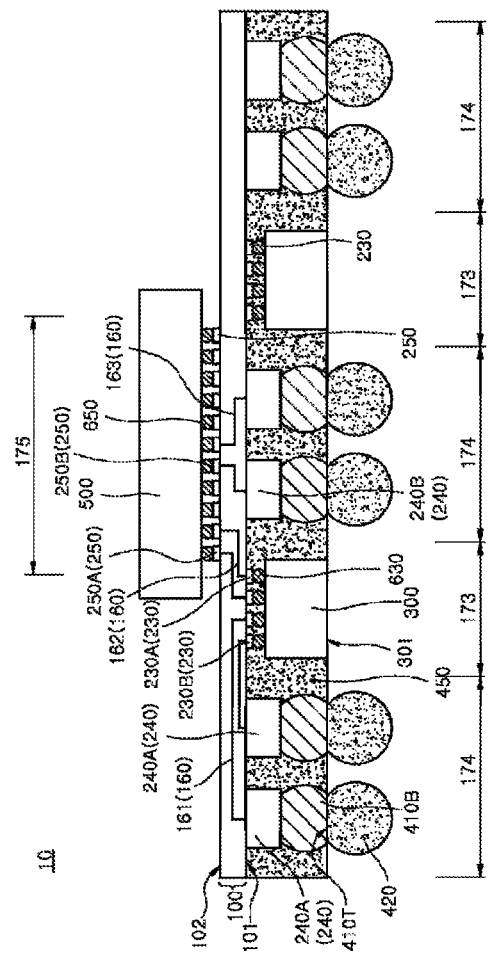
FIG. 26 is a cross-sectional view illustrating a structure of a semiconductor package according to an embodiment.
Figure 27:
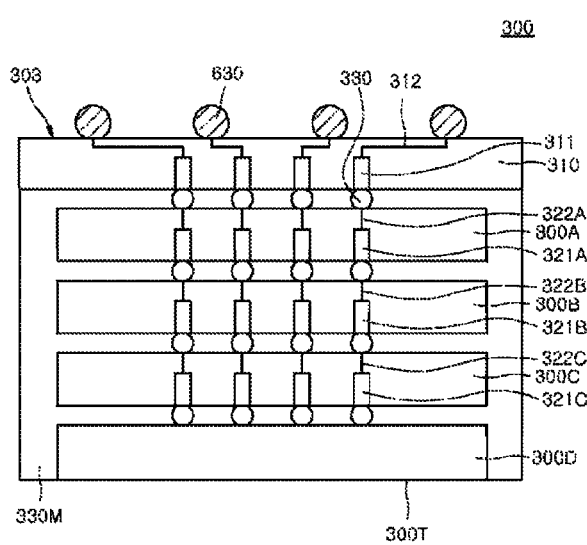
FIG. 27 is a cross-sectional view illustrating a semiconductor device included in a semiconductor package according to an embodiment.

FIG. 26 is a cross-sectional view illustrating a structure of the semiconductor package 10 according to an embodiment. FIG. 27 is an upside-down cross-sectional view illustrating one of the first semiconductor devices 300 included in the semiconductor package 10 of FIG. 26. The semiconductor package 10 shown in FIG. 26 may be realized using the fabrication processes described with reference to FIGS. 1 to 25.

As illustrated in FIG. 26, the second semiconductor device 500 may be disposed on the second surface 102 of the interconnection structure layer 100. Since the second semiconductor device 500 is bonded to the first bump pads 250 through the second chip connectors 650 using a soldering process, the second semiconductor device 500 may be mounted on the second surface 102 of the interconnection structure layer 100. The first semiconductor devices 300 may be disposed on the first surface 101 of the interconnection structure layer 100. The first semiconductor devices 300 may be disposed side by side on the first surface 101 of the interconnection structure layer 100. Since the first semiconductor devices 300 are bonded to the second bump pads 230 through the first chip connectors 630 using a soldering process, the first semiconductor devices 300 may be mounted on the first surface 101 of the interconnection structure layer 100.

The second semiconductor device 500 may have a different function than the first semiconductor devices 300, and the first and second semiconductor devices 300 and 500 may constitute a single unified system-in-package (CIP). The second semiconductor device 500 or each of the first semiconductor devices 300 may include a semiconductor substrate (not shown) such as a silicon substrate, active devices (not shown) such as transistors, and interconnection layers. The active devices may be formed on the semiconductor substrate, and the interconnection layers may be formed on the active devices and the semiconductor substrate. The interconnection layers may be formed to include an inter-layer dielectric (ILD) layer or an inter-metal dielectric (IMD) layer.

The second semiconductor device 500 may be a central processing unit (CPU) or a graphic processing unit (GPU). The second semiconductor device 500 may be provided in a chip form or a package form including a molding member that protects a chip. The second semiconductor device 500 may be disposed on the second surface 102 of the interconnection structure layer 100, and the first semiconductor devices 300 may be disposed on the first surface 101 of the interconnection structure layer 100 opposite the second semiconductor device 500. The second semiconductor device 500 may be vertically stacked on the first semiconductor devices 300. The second semiconductor device 500 may signally communicate with the first semiconductor devices 300 through an interface physical layer (PHY). Since the second semiconductor device 500 is vertically stacked on the first semiconductor devices 300, a length of signal paths between the second semiconductor device 500 and each of the first semiconductor devices 300 may be reduced to improve an operation speed of the semiconductor package 10. If the second semiconductor device 500 includes a GPU and the first semiconductor devices 300 are memory devices, a length of signal paths between the second semiconductor device 500 and each of the first semiconductor devices 300 may be reduced to improve an image data processing speed of the semiconductor package 10 including the GPU.

As illustrated in FIG. 27, the first semiconductor device 300 may include a plurality of semiconductor dice 310, 300A, 300B, 300C and 300D which are vertically stacked. For example, the master die 310, the first slave die 300A, the second slave die 300B, the third slave die 300C and the fourth slave die 300D may be sequentially and downwardly stacked. The plurality of dice 310, 300A, 300B, 300C and 300D may be electrically connected to each other by a through silicon via (TSV) structure including TSVs 311, 321A, 321B and 321C, internal interconnection lines 312, 322A, 322B and 322C, and connection bumps 330. The first semiconductor device 300 may further include side molding part 330M covering the slave dice 300A, 300B, 300C and 300D.

A top surface 300T of the fourth slave die 300D may be exposed to improve a heat emission efficiency of the semiconductor package 10. The top surface 300T of the fourth slave die 300D may correspond to the top surface 301 of the first semiconductor device 300. A surface 303 of the master die 310 opposite to the slave dice 300A, 300B, 300C and 300D may also be exposed, and the first chip connectors 630 may be attached to the surface 303 of the master die 310. The first semiconductor device 300 including the plurality of semiconductor dice 310, 300A, 300B, 300C and 300D may be a high performance memory device such as a high bandwidth memory (HBM) device.

Figure 28:
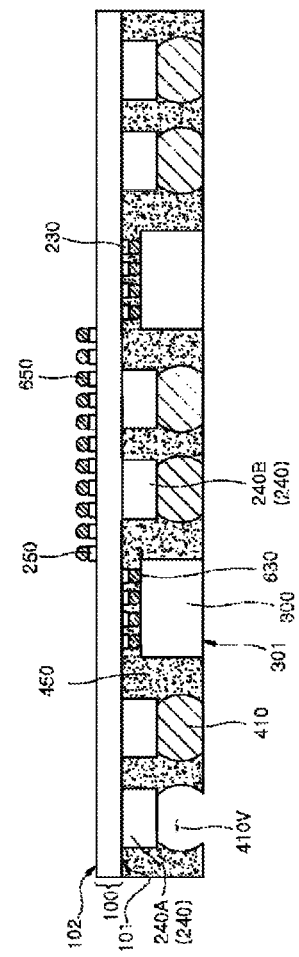
FIG. 28 is a cross-sectional view illustrating a defect of a semiconductor package.
Figure 29:
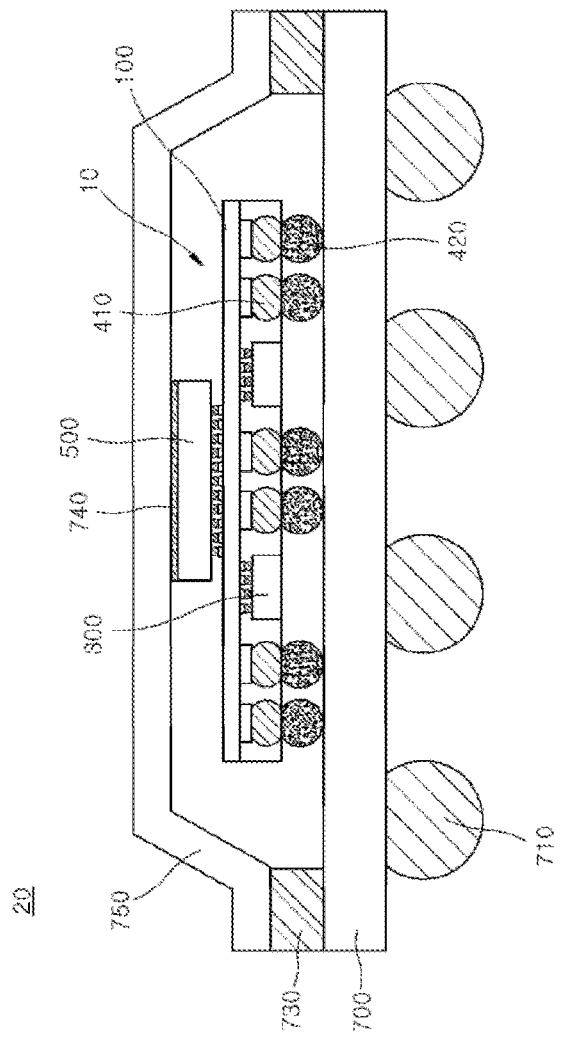
FIG. 29 is a cross-sectional view illustrating a semiconductor package according to another embodiment.

The interconnection structure layer 100 of the semiconductor package 10 shown in FIGS. 28 and 29 may be formed by depositing dielectric layers and conductive layers and by patterning the dielectric layers and the conductive layers. Thus, a thickness of the interconnection structure layer 100 may be reduced. This interconnection structure layer 100 may be formed using a fine patterning technique such as a wafer processing technique or a silicon processing technique. Accordingly, the interconnection portions 160 may be formed to include a plurality of interconnection lines having a fine pitch.

Referring to FIG. 26, in the semiconductor package 10, the TMBCs 410B may be disposed on the first surface 101 of the interconnection structure layer 100. The TMBCs 410B and the first semiconductor devices 300 may be disposed on the first surface 101 of the interconnection structure layer 100 to be adjacent to the first semiconductor devices 300. Each of the TMBCs 410B may include a copper ball. In some embodiments, each of the TMBCs 410B may include a plurality of copper balls which are vertically stacked to have a pillar shape. The TMBCs 410B may be bonded to the elevated pads 240, respectively. Thus, the TMBCs 410B may be electrically connected to the interconnection structure layer 100 through the elevated pads 240.

In the semiconductor package 10, the molding layer 450 may be provided to cover the first surface 101 of the interconnection structure layer 100 and to fill spaces between the TMBCs 410B and the first semiconductor devices 300. The outer connectors 420 may be attached to the TMBCs 410B, respectively. The TMBCs 410B may substantially penetrate the molding layer 450 to electrically connect the interconnection structure layer 100 to the outer connectors 420. The lower surfaces 410T of the TMBCs 410B may be exposed at a bottom surface of the molding layer 450 and may have a flat surface profile. The outer connectors 420 such as solder balls may be more readily attached to the lower surfaces 410T of the TMBCs 410B because the lower surfaces 410T of the TMBCs 410B are flat.

The interconnection structure layer 100 may include the signal paths 160, that is, interconnection portions. The interconnection portions 160 may include the horizontal interconnection portions 161, each of which electrically connects one of the second bump pads 230 to one of the elevated pads 240. The interconnection portions 160 may also include first vertical interconnection portions 162, each of which electrically connects one of the second bump pads 230 to one of the first bump pads 250.

Referring to FIGS. 17 and 26, the second semiconductor device 500 may be electrically connected to one of the first semiconductor devices 300 through some of the second chip connectors 650, some 250A of the first bump pad 250, some of the first vertical interconnection portions 162 connecting the first patterns 112 of the first outer conductive trace patterns 110 to first patterns 150B of the second outer conductive trace patterns 150, and some 230A of the second bump pads 230.

The first semiconductor devices 300 connected to the first vertical interconnection portions 162, may overlap with a portion of the second semiconductor device 500 connected to the same first vertical interconnection portions 162. In some case, the first semiconductor device 300 may be fully overlapped with the second semiconductor device 500. The first vertical interconnection portion 162 of the interconnection portions 160 may be located in a portion between the first and second semiconductors 300, 500. A length of the first vertical interconnection portion 162 can be shortened because the first semiconductor device 300 is vertically overlapped with the second semiconductor device 500. Thus, a signal path between the first and second semiconductor devices 300, 500 can be shortened. A logic device of the second semiconductor device 500 can communicate with memory devices of the first semiconductor devices 300 at a higher speed because of the short signal path between the first and second semiconductor devices 300, 500. Thus, it is possible to enhance an operating speed in a system including logic device and memory devices together.

In addition, the interconnection portions 160 may further include the second vertical interconnection portions 163, each of which electrically connects one of the elevated pads 240 to one of the first bump pads 250. The second semiconductor device 500 may be electrically connected to some of the outer connectors 420 through another of the second chip connectors 650, another 250B of the first bump pad 250, some of the second vertical interconnection portions 163 connecting the fourth patterns 115 of the first outer conductive trace patterns 110 to the second patterns 150C of the second outer conductive trace patterns 150, and some 240B of the elevated pads 240. The second semiconductor device 500 may be directly connected to some of the outer connectors 420 without the first semiconductor devices 300.

The first semiconductor devices 300 may be electrically connected to some of the outer connectors 420 through the horizontal interconnection portions 161. The first semiconductor devices 300 may be directly connected to some of the outer connectors 420 without the second semiconductor device 500. The horizontal interconnection portions 161, as shown in FIG. 17, electrically connects the first semiconductor devices 300 to some 240A of the elevated pads 240.

The interconnection structure layer 100 of the semiconductor package 10 may be formed by deposition processes of dielectric layers and conductive layers and by patterning the layers. Thus, the interconnection structure layer 100 can have a very thin thickness. Because a silicon processing technique or a semiconductor processing technique may be applied in forming the interconnection structure layer 100, the interconnection portions 160 are formed as a plurality of very fine wiring lines.

FIG. 28 is a cross-sectional view of a portion of a defective semiconductor package when the TMBCs 410B are formed of solder balls. Since the TMBCs 410B are disposed to substantially penetrate the molding layer 450, it may be important to prevent generation of defects while the molding layer 450 is formed.

If the TMBCs 410B are formed of solder balls 410, the solder balls may come out of the molding layer 450 when the outer connectors (420 of FIG. 23) are attached to the solder balls 410. The outer connectors (420 of FIG. 23) may be attached to the solder balls 410 using a solder reflow process. In such a case, the solder balls 410 may be melted and the molding layer 450 may be expanded. Thus, at least of the solder balls 410 may undesirably come out of the molding layer 450 due to the heat generated by the solder reflow process and pressure applied to the solder balls 410. This is because the solder balls 410 containing a tin based solder material have a relatively low melting point of about 220 degrees Celsius. If at least one of the solder balls 410 is removed, a void 410V may be provided in the molding layer 450.

The loss of the solder balls 410 may cause a connection failure of the solder balls 410. However, according to the embodiments, the TMBCs 410B may be formed of metal balls having a melting point which is higher than a melting point of a tin (Sn) material. Thus, it may prevent the void 410V from being formed in the molding layer 450. In some embodiments, the TMBCs 410B may be formed of metal balls having a melting point which is at least twice that of a tin (Sn) material. For example, each of the TMBCs 410B may be formed to include a copper ball. In such a case, the TMBCs 410B may also have a high electrical conductivity to reduce an electrical resistance of the TMBCs 410B. The copper ball may be coated by a nickel layer or a nickel solder layer.

FIG. 29 is a cross-sectional view illustrating a semiconductor package 20 according to another embodiment. The semiconductor package 20 may be configured to include a package substrate 700 and the semiconductor package 10 (illustrated in FIG. 26) mounted on the package substrate 700. The package substrate 700 may electrically connect the semiconductor package 10 to an electronic product. The package substrate 700 may include connectors 710 such as solder balls. The package substrate 700 may be a printed circuit board (PCB). The semiconductor package 20 may further include a heat spreader 750 attached to an upper surface of the second semiconductor device 500 using a thermal interface material layer 740. The second heat spreader 750 may be attached to the package substrate 700 using a stiffener 730. The semiconductor package 10 may be disposed in a space which is surrounded by the heat spreader 750, the stiffener 730 and the package substrate 700.

Figure 30:
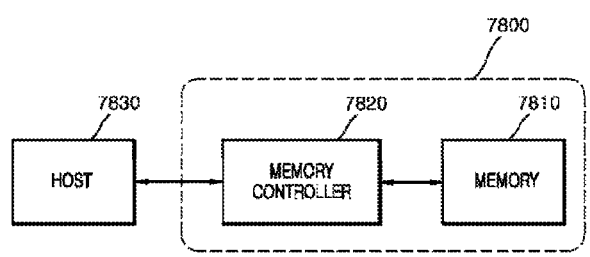
FIG. 30 is a block diagram illustrating an electronic system employing a memory card including at least one of the packages according to some embodiments.

FIG. 30 is a block diagram illustrating an electronic system including a memory card 7800 including at least one semiconductor package according to an embodiment. The memory card 7800 includes a memory 7810, such as a nonvolatile memory device, and a memory controller 7820. The memory 7810 and the memory controller 7820 may store data or read stored data. The memory 7810 and/or the memory controller 7820 include at least one of the semiconductor packages according to some embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 31:
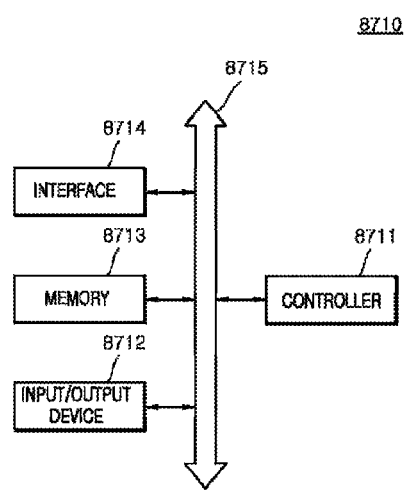
FIG. 31 is a block diagram illustrating an electronic system including at least one of the packages according to some embodiments.

FIG. 31 is a block diagram illustrating an electronic system 8710 including at least one package according to an embodiment. The electronic system 8710 may include a controller 8711, an input/output device 8712, and a memory 8713. The controller 8711, the input/output device 8712 and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is equipment capable of performing wireless communication, the electronic system 8710 may be used in a communication system such as of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) and Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A method of manufacturing a semiconductor package, the method comprising:

forming an interconnection structure layer including conductive trace patterns and a dielectric layer on a dummy wafer;

attaching a carrier wafer to a second surface of the interconnection structure layer opposite to the dummy wafer;

recessing the dummy wafer to expose a first surface of the interconnection structure layer opposite to the carrier wafer;

forming first bump pads and elevated pads on the first surface of the interconnection structure layer, the elevated pads being thicker than the first bump pads;

connecting at least one first semiconductor device to the first bump pads;

connecting through mold ball connectors to the elevated pads;

forming a molding layer on the first surface of the interconnection structure layer to expose a portion of each of the through mold ball connectors;

attaching outer connectors to the exposed portions of the through mold ball connectors, respectively; and mounting a second semiconductor device on the second surface of the interconnection structure layer.

2. The method of claim 1, wherein the dummy wafer is a silicon wafer.

3. The method of claim 1, wherein the conductive trace patterns are formed to include first vertical interconnection portions electrically connecting the first semiconductor device to the second semiconductor device, second vertical interconnection portions electrically connecting the second semiconductor device to some of the outer connectors, and horizontal interconnection portions electrically connecting the first semiconductor device to some other of the outer connectors.

4. The method of claim 1, wherein forming the interconnection structure layer includes:
forming a conductive layer on the dummy wafer;
patterning the conductive layer; and
forming the dielectric layer covering the outer conductive trace patterns.

5. The method of claim 1, further comprising forming second bump pads on the second surface of the interconnection structure layer before the carrier wafer is attached to the second surface of the interconnection structure layer,
wherein the second bump pads are connected to the second semiconductor device.

6. The method of claim 1, wherein forming the first bump pads and the elevated pads includes:
forming first resist pattern having first openings, the first openings exposing regions to the first bump pads located on the first surface of the interconnection structure layer;
forming the first bump pads in the first openings, respectively;
removing the first resist pattern;
forming second resist pattern having second openings, the first openings exposing regions to the elevated pads located on the first surface of the interconnection structure layer and the second resist pattern being thicker than the first resist pattern to cover the first bump pads; and
forming the elevated pads in the second openings, respectively.

7. The method of claim 6, further comprising forming a seed layer on the first surface of the interconnection structure layer.

8. The method of claim 1, wherein each of the elevated pads is formed to comprise a solder layer.

9. The method of claim 1, wherein each of the through mold ball connectors is formed to comprise a solderless metal ball.

10. The method of claim 1, wherein each of the through mold ball connectors is formed to comprise a copper ball.

11. The method of claim 1, wherein each of the outer connectors comprises a solder ball.

12. The method of claim 1,
wherein the second semiconductor device includes a microprocessor; and
wherein the first semiconductor device includes a high bandwidth memory (HBM) device.

13. The method of claim 1, wherein recessing the dummy wafer includes applying a grinding process to the dummy wafer.

14. The method of claim 1, wherein forming the molding layer includes:
molding a molding material covering the first semiconductor device and the through mold ball connectors disposed on the first surface of the interconnection structure layer; and
recessing the molding material to form the molding layer exposing a surface of the first semiconductor device.

15. The method of claim 14, wherein while the molding material is recessed, a portion of each of the through mold ball connectors is recessed to provide a flat surface of each through mold ball connector.

16. A semiconductor package comprising:
first bump pads on a first surface of an interconnection structure layer;
elevated pads thicker than the first bump pads on the first surface of the interconnection structure layer;
a first semiconductor device connected on the first bump pads;
through mold ball connectors connected on the elevated pads, respectively;
a molding layer disposed covering the first surface of the interconnection structure layer to expose a portion of each of the through mold ball connectors;
outer connectors respectively attached to the through mold ball connectors; and
a second semiconductor device on a second surface of the interconnection structure layer opposite to the molding layer.

17. The semiconductor package of claim 16, wherein the first semiconductor device vertically overlaps with the second semiconductor device.

18. The semiconductor package of claim 17, wherein interconnection structure layer includes first vertical interconnection portions, the first vertical interconnection portions electrically connecting the first semiconductor device to the second semiconductor device.

19. The semiconductor package of claim 16, wherein interconnection structure layer includes:
a dielectric body;
first vertical interconnection portions electrically connecting the first semiconductor device to the second semiconductor device;
second vertical interconnection portions electrically connecting the second semiconductor device to some of the outer connectors; and
horizontal interconnection portions electrically connecting the first semiconductor device to some others of the outer connectors.

20. The semiconductor package of claim 16, wherein the outer connectors connected to the second vertical interconnection portions are disposed to vertically overlap with the second semiconductor device.

* * * * *